US011133317B2

(12) United States Patent
Lee et al.

(10) Patent No.: US 11,133,317 B2
(45) Date of Patent: Sep. 28, 2021

(54) DRAM WITH A HYDROGEN-SUPPLY LAYER AND A HIGH-CAPACITANCE EMBEDDED CAPACITOR WITH A CYLINDRICAL STORAGE NODE

(71) Applicant: SAMSUNG ELECTRONICS CO., LTD., Suwon-si (KR)

(72) Inventors: Jun-Won Lee, Asan-si (KR); Hyuk-Woo Kwon, Seoul (KR); Ik-Soo Kim, Yongin-si (KR); Byoung-Deog Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 64 days.

(21) Appl. No.: 16/420,387

(22) Filed: May 23, 2019

(65) Prior Publication Data

US 2020/0152634 A1 May 14, 2020

(30) Foreign Application Priority Data

Nov. 9, 2018 (KR) .................... 10-2018-0137152

(51) Int. Cl.
*H01L 27/108* (2006.01)
*H01L 21/768* (2006.01)
*H01L 21/311* (2006.01)
*H01L 21/02* (2006.01)
*H01L 21/8234* (2006.01)

(52) U.S. Cl.
CPC .... *H01L 27/1085* (2013.01); *H01L 21/02129* (2013.01); *H01L 21/02131* (2013.01); *H01L 21/02164* (2013.01); *H01L 21/311* (2013.01); *H01L 21/76802* (2013.01); *H01L 21/76877* (2013.01); *H01L 21/823468* (2013.01); *H01L 27/10805* (2013.01); *H01L 27/10855* (2013.01)

(58) Field of Classification Search
CPC ......... H01L 27/10814; H01L 27/10852; H01L 27/10855; H01L 21/02126; H01L 21/02129; H01L 21/02131; H01L 21/76802; H01L 21/76877
See application file for complete search history.

(56) References Cited

U.S. PATENT DOCUMENTS 6,849,894 B2   2/2005   Lin et al.
7,462,568 B2   12/2008  Chung
7,678,714 B2   3/2010   Ikebuchi
(Continued)

FOREIGN PATENT DOCUMENTS

JP   2003-0224206 A    8/2003
JP   2003224206 A  *   8/2003
(Continued)

*Primary Examiner* — Marcos D. Pizarro
(74) *Attorney, Agent, or Firm* — Lee IP Law, P.C.

(57) ABSTRACT

A semiconductor device and a method of manufacturing a semiconductor device, the device including a substrate; a lower structure including pad patterns on the substrate, upper surfaces of the pad patterns being at an outer side of the lower structure; a plurality of lower electrodes contacting the upper surfaces of the pad patterns; a dielectric layer and an upper electrode sequentially stacked on a surface of each of the lower electrodes; and a hydrogen supply layer including hydrogen, the hydrogen supply layer being between the lower electrodes and closer to the substrate than the dielectric layer is to the substrate.

18 Claims, 24 Drawing Sheets

(56) References Cited

U.S. PATENT DOCUMENTS

| | | |
|---|---|---|
| 9,337,203 B2 | 5/2016 | Hwang et al. |
| 9,917,091 B2 | 3/2018 | Kugimiya et al. |
| 2018/0175042 A1* | 6/2018 | Jang .................. H01L 27/10876 |
| 2018/0175044 A1 | 6/2018 | Rhie |

FOREIGN PATENT DOCUMENTS

| | | |
|---|---|---|
| JP | 4729863 B2 | 7/2011 |
| KR | 10-2006-0036560 A | 5/2006 |

* cited by examiner

US 11,133,317 B2

DRAM WITH A HYDROGEN-SUPPLY LAYER AND A HIGH-CAPACITANCE EMBEDDED CAPACITOR WITH A CYLINDRICAL STORAGE NODE

CROSS-REFERENCE TO RELATED APPLICATION

Korean Patent Application No. 10-2018-0137152, filed on Nov. 9, 2018, in the Korean Intellectual Property Office, and entitled: "A Semiconductor Device," is incorporated by reference herein in its entirety.

BACKGROUND

1. Field

Embodiments relate to a semiconductor device.

2. Description of the Related Art

In a highly integrated DRAM device, a failure of refresh could occur due to defects such as dangling bonds included in a surface portion of a substrate. Removing the defects included in the substrate may be considered.

SUMMARY

The embodiments may be realized by providing a semiconductor device including a substrate; a lower structure including pad patterns on the substrate, upper surfaces of the pad patterns being at an outer side of the lower structure; a plurality of lower electrodes contacting the upper surfaces of the pad patterns; a dielectric layer and an upper electrode sequentially stacked on a surface of each of the lower electrodes; and a hydrogen supply layer including hydrogen, the hydrogen supply layer being between the lower electrodes and closer to the substrate than the dielectric layer is to the substrate.

The embodiments may be realized by providing a semiconductor device including a substrate; a lower structure on the substrate, the lower structure including pad patterns and a lower insulation pattern between the pad patterns, upper surfaces of the pad patterns and the lower insulation pattern being at an outer side of the lower structure; a first etch stop layer on the pad pattern and the lower insulation pattern; a hydrogen supply layer including hydrogen, the hydrogen supply layer being on the first etch stop layer; a plurality of lower electrodes passing through the hydrogen supply layer and the first etch stop layer, the plurality of lower electrodes contacting the upper surfaces of the pad patterns; and a dielectric layer and an upper electrode sequentially stacked on a surface of each of the lower electrodes.

The embodiments may be realized by providing a semiconductor device including a substrate; a lower structure on the substrate, the lower structure including pad patterns and a hydrogen supply pattern between the pad patterns, upper surfaces of the pad patterns and the hydrogen supply pattern being at an outer side of the lower structure; a plurality of lower electrodes on the lower structure, the plurality of lower electrodes contacting the upper surfaces of the pad patterns; and a dielectric layer and an upper electrode sequentially stacked on a surface of each of the lower electrodes.

The embodiments may be realized by providing a method of manufacturing a semiconductor device, the method including forming a lower structure on a substrate, the lower structure including pad patterns and a lower insulation pattern between the pad patterns such that upper surfaces of the pad patterns and the lower insulation pattern are exposed at an outer side of the lower structure; forming a hydrogen supply layer on the lower structure such that the hydrogen supply layer includes hydrogen; forming a plurality of lower electrodes passing through the hydrogen supply layer, the lower electrodes contacting the upper surfaces of the pad patterns; and forming a dielectric layer and an upper electrode sequentially stacked on a surface of each of the lower electrodes.

The embodiments may be realized by providing a method of manufacturing a semiconductor device, the method including forming a lower structure on a substrate, the lower structure including pad patterns and a hydrogen supply pattern between the pad patterns such that upper surfaces of the pad patterns and the hydrogen supply pattern are exposed at an outer side of the lower structure; forming lower electrodes on the lower structure, the lower electrodes contacting the upper surfaces of the pad patterns; and forming a dielectric layer and an upper electrode sequentially stacked on a surface of each of the lower electrodes.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
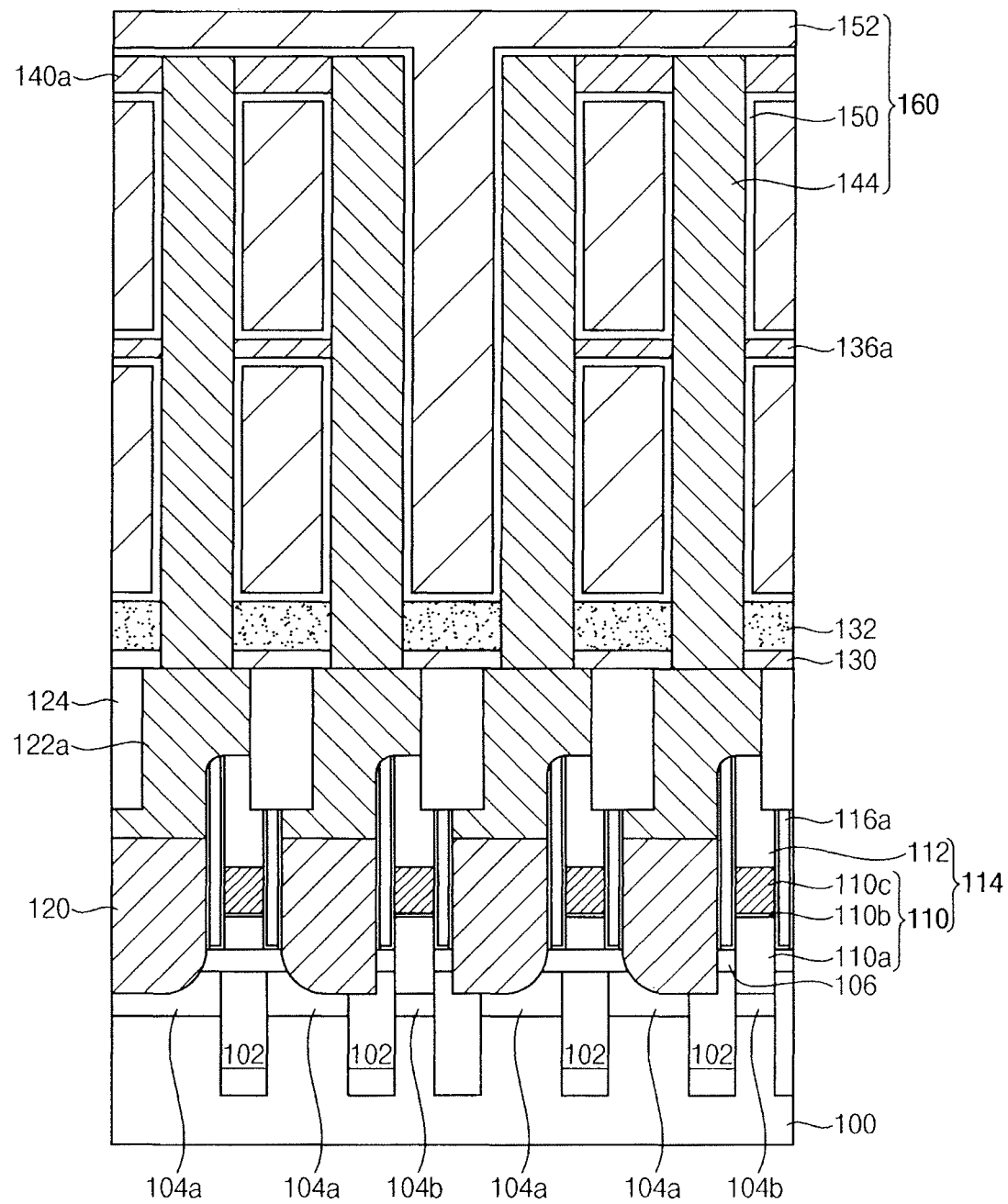
FIG. 1 illustrates a cross-sectional view of a semiconductor device in accordance with example embodiments.

FIG. 1 illustrates a cross-sectional view of a semiconductor device in accordance with example embodiments. The semiconductor device may be a DRAM device.

Referring to FIG. 1, the semiconductor device may include a lower structure on a substrate 100. A etch stop layer 130, a hydrogen supply layer 132, a first support pattern 136a, a second support pattern 140a, and a capacitor 160 may be on the lower structure.

The lower structure may include, e.g., a transistor, a bit line structure 114, a contact plug 120, pad patterns 122a, an upper insulation pattern 124, and the like. Upper surfaces of the pad patterns 122a and the upper insulation pattern 124 may correspond to an uppermost surface of the lower structure. The upper insulation pattern 124 may fill a space between the pad patterns 122a. The upper surfaces of the pad patterns 122a and the upper insulation pattern 124 may be flat, and may be coplanar with each other.

The substrate 100 may be a semiconductor substrate. An isolation layer 102 for dividing an active region and a field region may be formed at the substrate 100. The transistor may include a gate structure, and first and second impurity regions 104a and 104b. The gate structure may have a buried structure. For example, the gate structure may be buried in an upper portion of the substrate 100.

An insulation pattern 106 may be on the substrate 100.

The bit line structure 114 may extend in one direction to have a line shape, and the bit line structure 114 may contact the second impurity region 104b. The bit line structure 114 may be on the insulation pattern 106 and the second impurity region 104b. The bit line structure 114 may include a conductive pattern structure 110 and a first mask pattern 112 sequentially stacked. In an implementation, the conductive pattern structure 110 may include a polysilicon pattern 110a, a barrier pattern 110b, and a metal pattern 110c sequentially stacked. The first mask pattern 112 may include, e.g., silicon nitride, SiBN, SiCN, or the like.

In an implementation, an air spacer 116a (e.g., air gap) may be on a sidewall of the bit line structure 114. In an implementation, an insulation spacer including insulation material may be on a sidewall of the bit line structure 114.

The contact plug 120 may be between the bit line structures 114, and may contact the first impurity regions 104a. In an implementation, the contact plug 120 may include polysilicon. In an implementation, an upper surface of the contact plug 120 (e.g., a surface facing away from the substrate 100) may be lower than (e.g., closer to the substrate 100 than) an upper surface of the bit line structure 114.

The pad pattern 122a may be on the contact plug 120. In an implementation, the pad pattern 122a may include a metal silicide and metal sequentially stacked. The metal silicide may include, e.g., cobalt silicide, tungsten silicide, or the like, and the metal may include, e.g., tungsten or the like.

The upper insulation pattern 124 may contact at least a portion of the first mask pattern 112 of the bit line structure 114. The air spacer 116a may be under a bottom of the upper insulation pattern 124 (e.g., between the air spacer 116a and the substrate 100).

In an implementation, the upper insulation pattern 124 may not be damaged or removed by an etchant used in a wet etching process for removing mold layers. For example, the upper insulation pattern 124 may include a material having a low etching rate with respect to wet etchant of silicon oxide, so that the upper insulation pattern 124 may not be etched by the wet etchant of silicon oxide. The wet etchant of the silicon oxide may include a LAL etchant including mixture of, e.g., hydrogen fluoride (HF), ammonium fluoride ($NH_4F$) and deionized water. In an implementation, the upper insulation pattern 124 may include silicon nitride, SiCN, SiBN, SiON, or the like.

The etch stop layer 130 may be on the lower structure. For example, the etch stop layer 130 may be on the pad patterns 122a and the upper insulation pattern 124.

The etch stop layer 130 may serve as a stop layer in a dry etching process of the mold layers for forming openings. For example, the etch stop layer 130 may include an insulation material having a high etching selectivity with respect to silicon oxide, in the dry etching process. In an implementation, the etch stop layer 130 may include silicon nitride, SiCN, SiBN, SiON, or the like.

The hydrogen supply layer 132 may be on the etch stop layer 130. The hydrogen supply layer 132 may include, e.g., a hydrogen rich oxide including hydrogen. For example, the hydrogen supply layer 132 may include a material including covalently bonded hydrogen atoms. The hydrogen supply layer 132 may include an insulation material. The hydrogen supply layer 132 may supply hydrogen to surface portions of the substrate 100. The hydrogen supply layer 132 may have a uniform thickness depending on positions thereof.

In an implementation, the hydrogen supply layer 132 may include a material that may be hardly etched in wet etching process for removing the mold layers. For example, the hydrogen supply layer 132 may also serve as an etch stop layer in the wet etching process. The hydrogen supply layer 132 may include a material having a low etching rate for a wet etchant of the silicon oxide. In an implementation, the hydrogen supply layer 132 may have an etching rate of 5 Å/min or less with respect to the wet etchant of silicon oxide. In an implementation, the hydrogen supply layer 132 may have an etching rate of 1 Å/min or less with respect to the wet etchant of silicon oxide.

In an implementation, the hydrogen supply layer 132 may include an oxide including Si—H bonding, and further including carbon, e.g., SiOCH. In an implementation, the hydrogen included in the hydrogen supply layer 132 may be diffused out and transferred to the substrate 100 during processes, and thus the hydrogen supply layer 132 (that is, a remained hydrogen supply layer) may include an oxide including carbon, e.g., SiOC.

If the hydrogen supply layer 132 were to be deposited at a temperature of 400° C. or higher, hydrogen covalent bonds, e.g., Si—H bonds, included in the hydrogen supply layer 132 could be mostly removed during the deposition process. In an implementation, the hydrogen supply layer 132 may be formed by a low-temperature deposition process performed at 400° C. or lower. For example, the hydrogen supply layer 132 may be a SiOCH layer formed by a low-temperature plasma process performed at 400° C. or lower.

Silicon nitride (SiN) may have a low hydrogen content, and silicon oxide ($SiO_2$) may be rapidly removed by the wet etchant of silicon oxide. When an etching rate of the silicon oxide is high in an etching process, remaining silicon oxide may not have uniform thickness after the etching process. Thus, the silicon nitride and the silicon oxide may not be suitable as the hydrogen supply layer.

The hydrogen included in the hydrogen supply layer 132 may move to the surface of the substrate 100 through a metal or a conductive material at a bottom of the hydrogen supply layer 132. For example, the hydrogen may be supplied to a surface portion of the substrate 100 and an inner portion of a gate insulation layer of the transistor. Dangling bonds or trap sites in the gate insulation layer may be removed by the hydrogen. Also, defects such as GIDL (Gate Induced Drain Leakage) of the transistor on the substrate may decrease. For example, in a case of the DRAM device, refresh characteristics may be improved.

The capacitor 160 may have a lower electrode 144, a dielectric layer 150, and an upper electrode 152 (e.g., stacked).

The lower electrode 144 may be on an upper surface of each of the pad patterns 122a (e.g., and through the hydrogen supply layer 132 and the etch stop layer 130). For example, the hydrogen supply layer 132 may be between the lower electrodes 144. The hydrogen supply layer 132 may contact lower sidewalls of the lower electrodes 144. For increasing a storage capacitance of the capacitor 160, each of the lower electrodes 144 may have a high aspect ratio.

In an implementation, the lower electrode 144 may have a pillar shape.

In an implementation, the lower electrode 144 may include a metal or a metal nitride. For example, the lower electrode 144 may include titanium, titanium nitride, tantalum, tantalum nitride, or the like. In an implementation, the lower electrode 144 may include polysilicon.

Each of the first and second support patterns 136a and 140a may contact portions of the sidewalls of the lower electrodes 144 to support the lower electrodes 144. Thus, a leaning of the lower electrodes 144 may be prevented by the first and second support patterns 136a and 140a. For example, each of the first and second support patterns 136a and 140a may be connected or in contact with the sidewalls of the neighboring lower electrodes 144. Also, each of the first and second support patterns 136a and 140a may include holes. For example, in a plan view, each of the first and second support patterns 136a, 140a may have a mesh shape.

In an implementation, as shown in FIG. 1, the first support pattern 136a may be on the sidewall of a middle portion of the lower electrode 144, and the second support pattern 136a may be on the sidewall of an upper portion of the lower electrode 144. In an implementation, one or more support patterns may be on the sidewall of the lower electrode.

The first and second support patterns 136a and 140a may include an insulation material that is hardly removed in the wet etching process of the mold layers. For example, the first and second support patterns 136a and 140a may have a low etching rate with respect to the wet etchant of the silicon oxide. In an implementation, each of the first and second support patterns 136a and 140a may include silicon nitride, SiCN, SiBN, SiON, or the like.

The dielectric layer 150 may be conformally formed on a surface of the lower electrode 144, the surfaces of the first and second support patterns 136a and 140a, and the hydrogen supply layer 132. The dielectric layer 150 may include a metal oxide having a high dielectric constant, e.g., hafnium oxide, zirconium oxide, aluminum oxide, tantalum oxide, etc. In an implementation, the dielectric layer 150 may include an ONO layer including silicon oxide, silicon nitride, and silicon oxide stacked.

In an implementation, the dielectric layer 150 may not contact the etch stop layer 130, and may be higher than (e.g., farther from the substrate 100 than) an upper surface of the etch stop layer 130. In an implementation, the dielectric layer 150 may contact an upper surface of the hydrogen supply layer 132. For example, the hydrogen supply layer 132 may be lower than the dielectric layer 150 with respect to the surface of the substrate 100 (e.g., a distance from the hydrogen supply layer 132 to the surface of the substrate 100 may be less than a distance from the dielectric layer 150 to the surface of the substrate 100). In an implementation, the hydrogen supply layer 132 may be higher than (e.g., farther from the substrate 100 than) a bottom of the bit line structure 114.

The upper electrode 152 may be on the dielectric layer 150. In an implementation, the upper electrode 152 may fill a gap between the lower electrodes 144. In an implementation, the upper electrode 152 may include a metal or a metal nitride. For example, the upper electrode 152 may include titanium, titanium nitride, tantalum, tantalum nitride, or the like. In an implementation, the upper electrode 152 may include polysilicon.

As described above, the hydrogen supply layer 132 may be higher than the bottom of the bit line structure 114, and lower than the dielectric layer 150 of the capacitor 160. For example, the hydrogen supply layer 132 may not be higher than the capacitor 160, and the distance between the hydrogen supply layer 132 and the substrate 100 may decrease. Therefore, the hydrogen may be efficiently supplied to the surface portion of the substrate 100 from the hydrogen supply layer 132. Further, the hydrogen supply layer 132 may be lower than the dielectric layer 150, and the hydrogen may be hardly or negligibly diffused into the dielectric layer 150. For example, defects such as damage to the dielectric layer 150 and/or a crystallization of the dielectric layer 150 due to the hydrogen may decrease.

In addition, the hydrogen supply layer 132 may have a uniform thickness depending on positions thereof, and amounts of the hydrogen supplied to the substrate may be uniform. Thus, a storage capacitance of each of the capacitors may be uniform. Also, the semiconductor device may have a high reliability due to decreasing of process variations in a manufacturing the semiconductor device.

FIGS. 2 to 9 illustrate cross-sectional views of stages in a method of manufacturing a semiconductor device in accordance with example embodiments.

Figure 2:
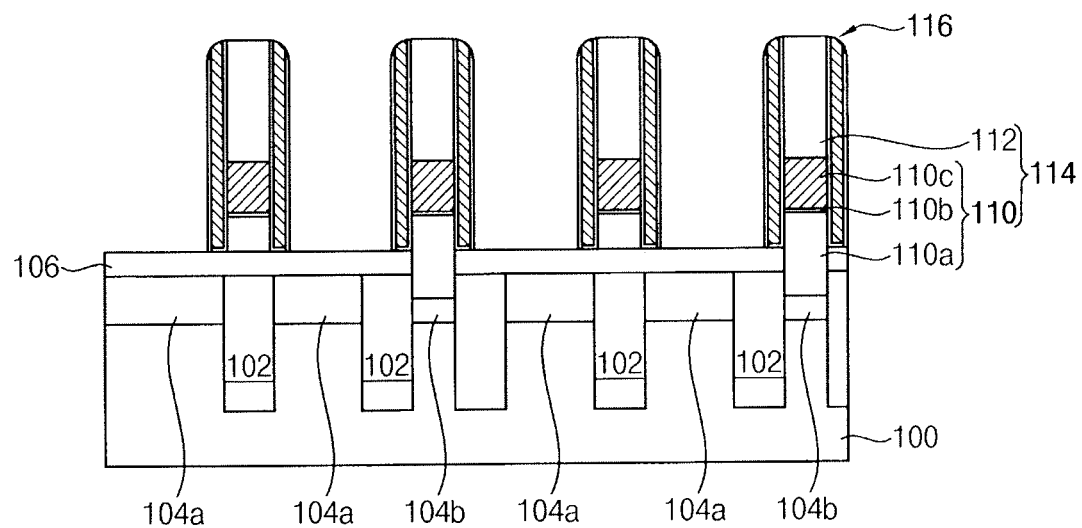
FIGS. 2 to 9 illustrate cross-sectional views of stages in a method of manufacturing a semiconductor device in accordance with example embodiments.
Figure 3:
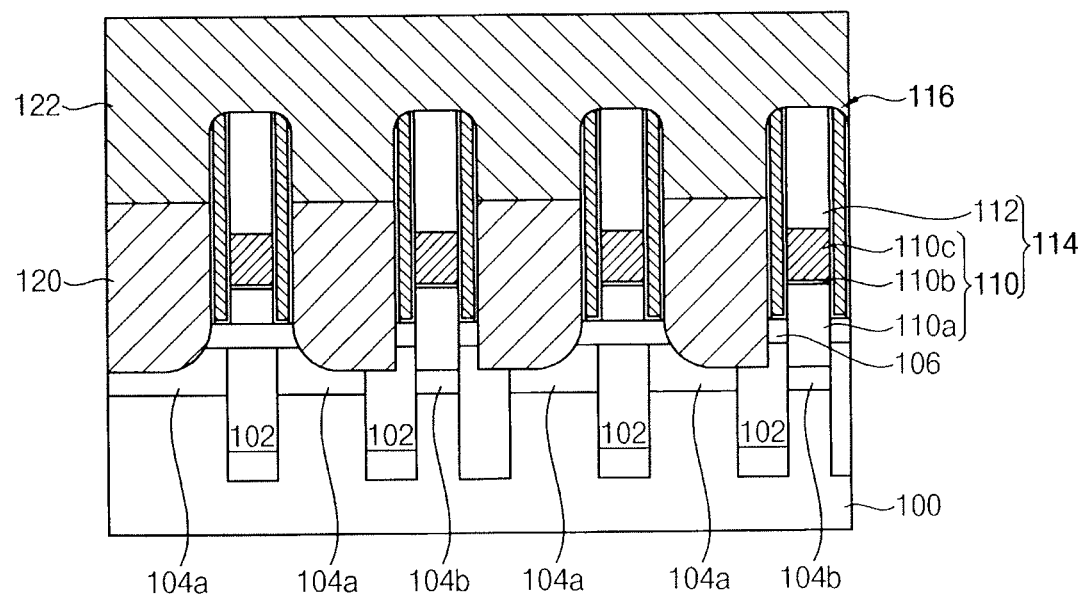
Figure 4:
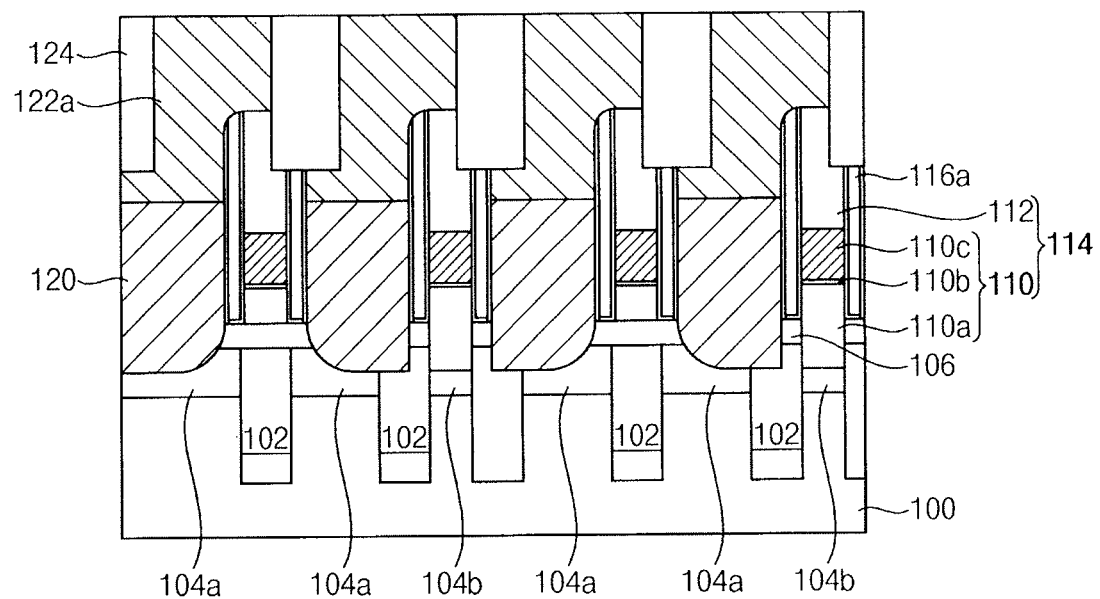

Referring to FIGS. 2 to 4, a lower structure may be formed on the substrate 100. The lower structure may include, e.g., a transistor, a bit line structure 114, a contact plug 120, pad patterns 122a, and an upper insulation pattern 124. Upper surfaces of the pad patterns 122a and the upper insulation pattern 124 may correspond to an uppermost surface of the lower structure.

Hereinafter, an example of a method for forming the lower structure may be briefly described.

Referring to FIG. 2, a trench isolation process may be performed on a substrate 100 to form an isolation layer 102. Thus, the substrate 100 may be divided into active region and an isolation region by the isolation layer 102. Transistors may be formed on the substrate 100. Each of the transistors may include a gate structure and first and second impurity regions 104a and 104b.

In an implementation, the transistor may be a buried transistor. In this case, the substrate 100 may be etched to form a gate trench, and then the gate structure may be formed to fill the gate trench. The gate structure may include a gate insulation layer, a gate electrode, and a capping pattern stacked.

An insulation pattern 106 may be formed on the substrate 100. The second impurity region 104b may be exposed by or through the insulation pattern 106.

A bit line structure 114 may be formed on the second impurity region 104b and the insulation pattern 106. The bit line structure 114 may extend in one direction, and may be electrically connected to the second impurity region 104b.

A spacer 116 may be formed on a sidewall of the bit line structure 114. In an implementation, the spacer 116 may include silicon nitride.

Referring to FIG. 3, an insulation material may be formed to fill a space between the bit line structures 114. Then, portions of the insulation material and the insulation pattern 106 may be etched to form a contact hole exposing the first impurity region 104a between the bit line structures 114. Thereafter, a contact plug 120 may be formed in the contact hole to contact the first impurity region 104a.

A pad electrode layer 122 may be formed on the contact plug 120 to cover the bit line structure 114. The pad electrode layer 122 may include, e.g., a metal silicide layer and a metal layer. The metal silicide layer may include cobalt silicide, tungsten silicide, or the like. The metal layer may include tungsten, cobalt, aluminum, or the like.

Referring to FIG. 4, the pad electrode layer 122 may be patterned to form pad patterns 122a. Each of the pad patterns 122a may be electrically connected to the first impurity region 104a via the contact plug 120.

In an implementation, a portion of the spacer 116 may be exposed at a bottom of an opening between the pad patterns 122a. The spacer 116 may be removed by a wet etching process to form an air spacer 116a. In an implementation, the spacer may not be etched, and thus the spacer may be used as an insulation spacer.

Thereafter, an upper insulation layer may be formed to fill a space between the pad patterns 122a without filling the air spacer 116a. The upper insulation layer may be planarized until upper surfaces of the pad patterns 122a are exposed to form an upper insulation pattern 124. The upper insulation pattern 124 may fill the space between the pad patterns 122a. The upper surfaces of the pad patterns 122a and the upper insulation pattern 124 may be substantially coplanar with each other.

Although an etchant used in a subsequent removing process of mold layers may be introduced into the upper insulation pattern 124, the upper insulation pattern 124 may not be damaged or removed by the etchant in the removing process. Therefore, the upper insulation pattern 124 may have a low etching rate with respect to the etchant of silicon oxide. In an implementation, the upper insulation pattern 124 may include silicon nitride, SiCN, SiBN, SiON, or the like.

Figure 5:
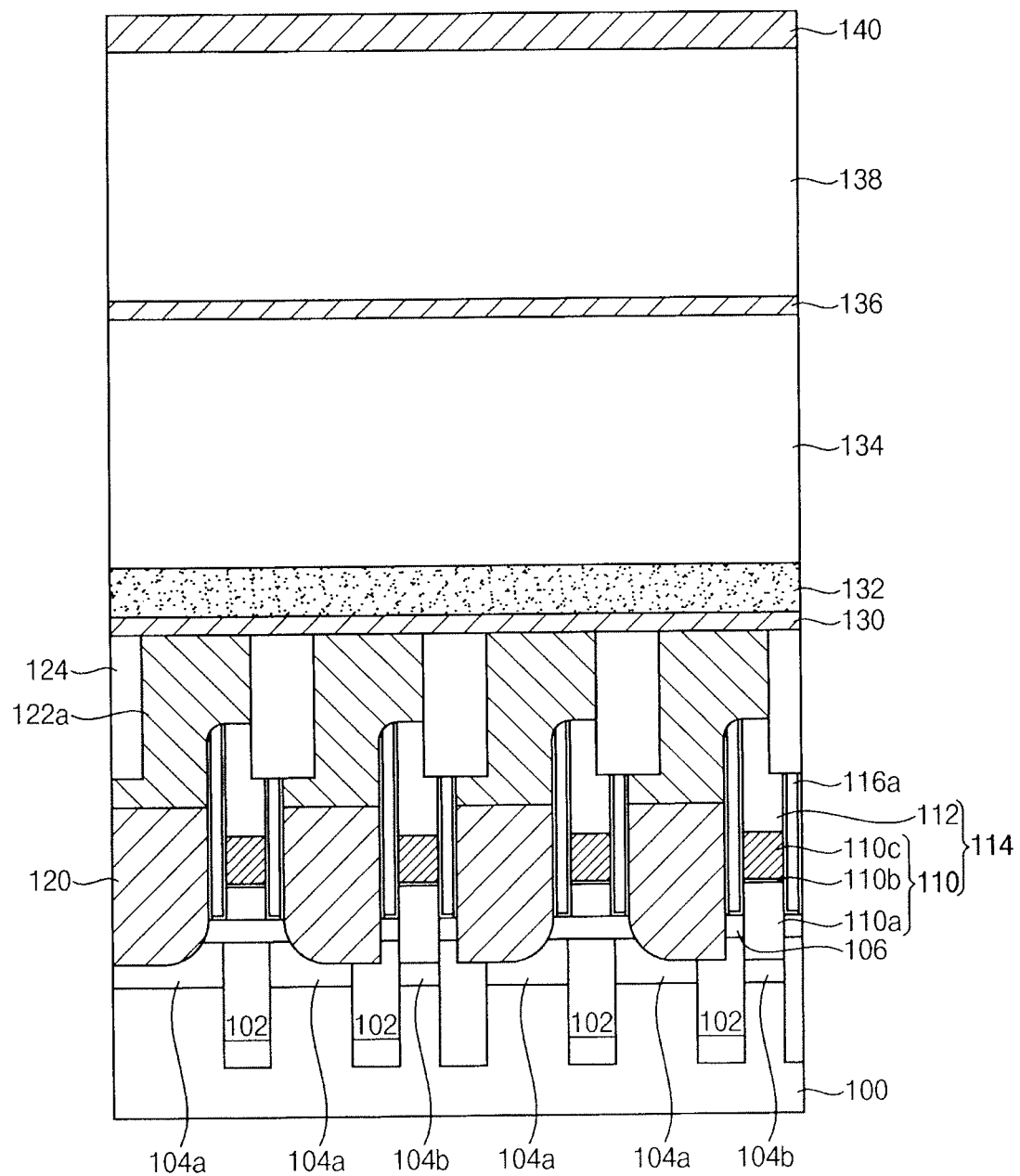

Referring to FIG. 5, an etch stop layer 130 may be formed on the pad patterns 122a and the upper insulation pattern 124. A hydrogen supply layer 132, a first mold layer 134, a first support layer 136, a second mold layer 138, and a second support layer 140 may be sequentially formed on the etch stop layer 130.

The etch stop layer 130 may include, e.g., silicon nitride, SiCN, SiBN, SiON, or the like.

The hydrogen supply layer 132 may include a hydrogen rich oxide including hydrogen. The hydrogen supply layer 132 may be an insulation material. The hydrogen supply layer 132 may include a material that is hardly or negligibly removed in a wet etching process for removing the first and second mold layers. In an implementation, the hydrogen supply layer 132 may have an etching rate of 5 Å/min or less, e.g., 1 Å/min or less, with respect to wet etchant of silicon oxide. In an implementation, the hydrogen supply layer 132 may include an oxide layer including carbon, e.g., a SiOCH layer or a SiOC layer. The SiOCH layer may be formed by a low temperature plasma deposition process performed at 400° C. or lower. The SiOCH layer formed at the low temperature may have a large amount of hydrogen, and may be hardly etched by the wet etchant of the silicon oxide.

The first mold layer 134 may include silicon oxide. For example, the first mold layer 134 may include FOX (Flowable Oxide), TOSZ (Tonen SilaZen), USG (Undoped Silica Glass), BSG (Borosilica Glass), PhosphoSilaca Glass (PSG), Borophosphosilicate Glass PE-TEOS (Plasma Enhanced Tetra Ethyl Ortho Silicate), or FSG (Fluoride Silicate Glass).

The first support layer 136 may include, e.g., silicon nitride, SiCN, SiBN, SiON, or the like.

The second mold layer 138 may include silicon oxide. The second mold layer 138 may include, e.g., PE-TEOS or HDP-CVD oxides. In an implementation, the second mold layer 138 may include an oxide having an impurity concentration that is different from an impurity concentration of the first mold layer 134. Thus, the second mold layer 138 may have an etching rate that is different from an etching rate of the first mold layer 134 in an etching process.

The second support layer 140 may include, e.g., silicon nitride, SiCN, SiBN, SiON, or the like.

In an implementation, two support layers may be formed between the mold layers. In an implementation, a single support layer or three or more support layers may be formed between the mold layers according to a structure of a capacitor.

Figure 6:
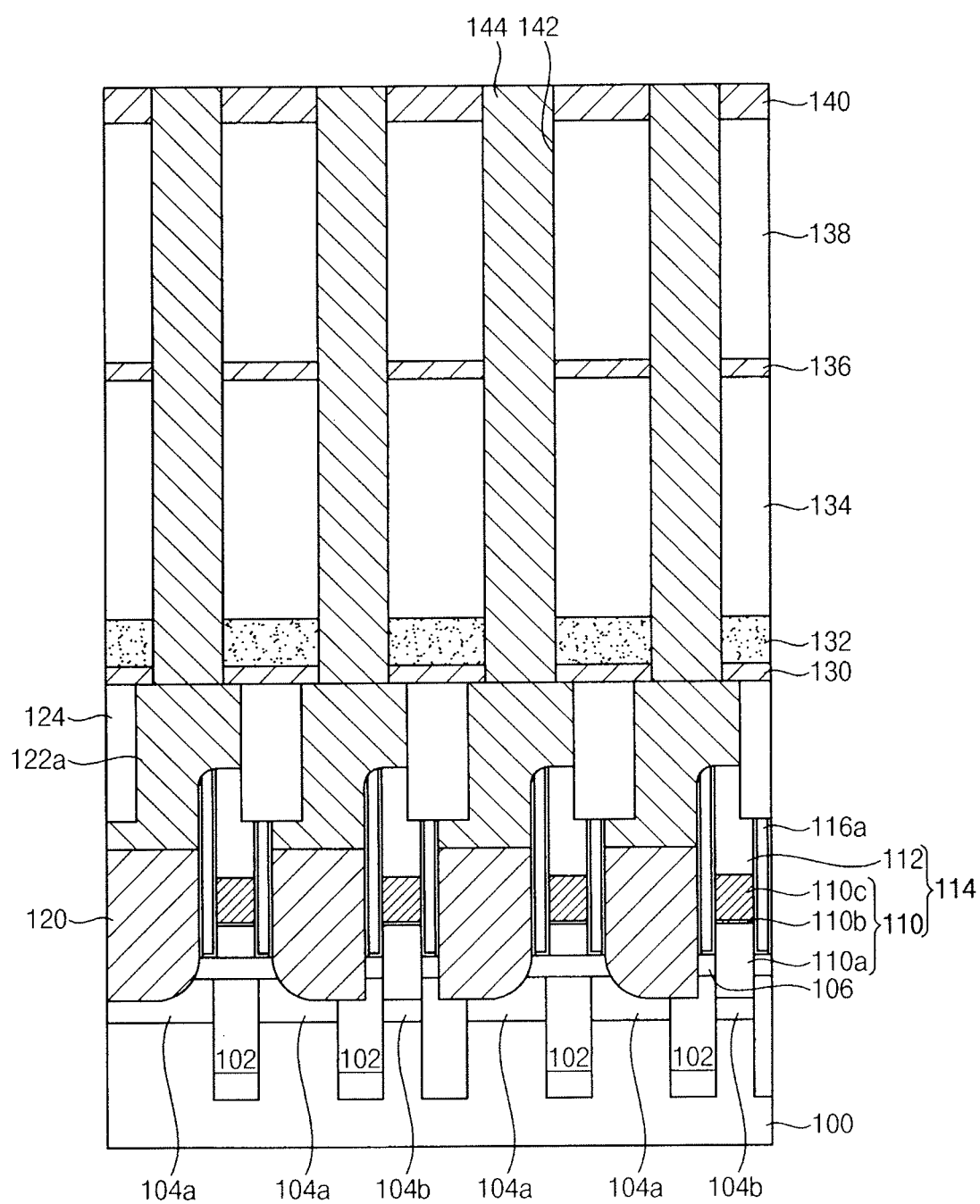

Referring to FIG. 6, an etch mask may be formed on the second support layer 140. The second support layer 140, the second mold layer 138, the first support layer 136, the first mold layer 134, the hydrogen supply layer 132, and the etch stop layer 130 may be sequentially etched to form openings 142 exposing upper surfaces of the pad patterns 122a.

A lower electrode 144 may be formed in each of the openings 142. In an implementation, the lower electrode 144 may have a pillar shape. Thus, the lower electrode 144 may completely fill the opening 142. For example, a lower electrode layer may be formed to fill the opening 142, and the lower electrode layer may be planarized until an upper surface of the second support layer 140 may be exposed to form the lower electrode 144.

Figure 7:
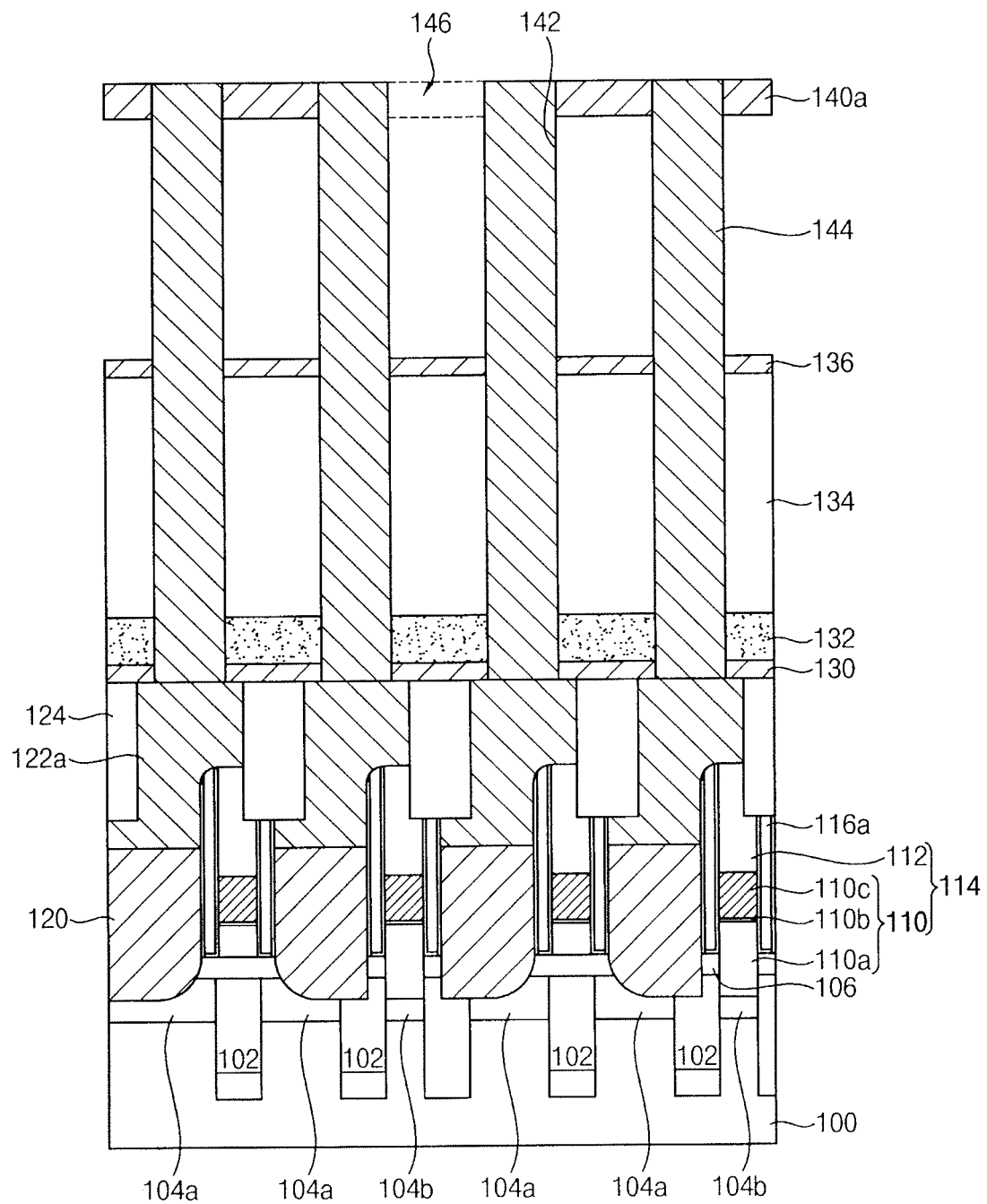

Referring to FIG. 7, portions of the second support layer 140 may be etched to form first holes 146 exposing upper portions of the second mold layer 138. Thus, a second support pattern 140a may be formed on the second mold layer 138. Thereafter, the second mold layer 138 may be wet etched by supplying the etchant of silicon oxide through the first holes 146. Thus, the first support layer 136 and upper sidewalls of the lower electrodes 144 may be exposed by the wet etching process.

The first holes 146 may serve as a supply passage of the etchant for removing the second mold layer 138. Thus, the first holes 146 may be appropriately formed according to the arrangement of the lower electrodes 144. In an implementation, the second support pattern 140a may contact an outer wall of a portion of the lower electrode 144 to have a connected shape. For example, in a plan view, the second support pattern 140a may have a mesh shape. In an implementation, in the process for removing the second mold layer 138, an LAL etchant may be used as the etchant.

Figure 8:
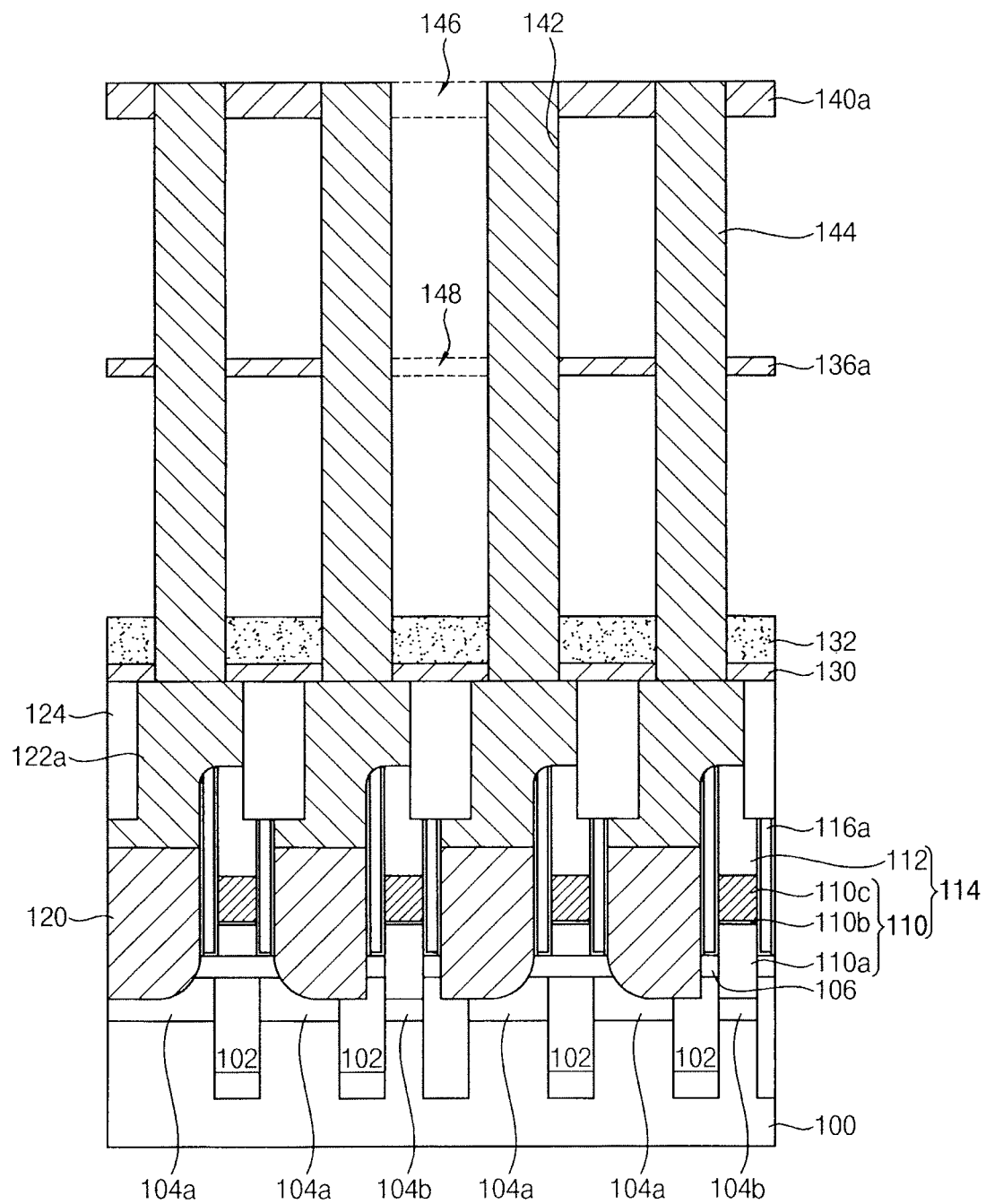

Referring to FIG. 8, portions of the first support layer 136 may be etched to form second holes 148 exposing upper portions of the first mold layer 134. Therefore, a first support pattern 136a may be formed on the first mold layer 134. Then, the first mold layer 134 may be wet etched by supplying the etchant of silicon oxide through the second holes 148.

In an implementation, the first support pattern 136a may contact a sidewall of a portion of the lower electrode to have a connected shape. For example, in a plan view, the first support pattern 136a may have a mesh shape. In an implementation, in the process for removing the first mold layer 134, the LAL etchant may be used as the etchant.

As the etchant flows through the first holes 146 between the first support patterns 136a and the second holes 148 between the second support patterns 140a, a flow amount of the etchant at a portion adjacent to the first and second holes 146 and 148 and a flow amount of the etchant at a portion far from the first and second holes 146 and 148 may be different from each other. For example, the flow amounts of the etchant may be slightly different depending on positions of the first and second mold layers 134 and 138. Therefore, the wet etching process may be sufficiently performed so that the first mold layer 134 may be completely etched at all portions thereof.

The hydrogen supply layer 132 may have a low etching rate with respect to the etchant of the silicon oxide, and the hydrogen supply layer 132 may hardly etched during the wet etching process of the first mold layer 134. Thus, the hydrogen supply layer 132 may remain to have a uniform thickness, after removing the first mold layer 134.

When the wet etching process is performed, a surface of the lower electrode 144 higher than an upper surface of the hydrogen supply layer 132 may be exposed. Also, a side wall of the lower electrode 144 may be supported by the first and second support patterns 136a and 140a. Thus, although the aspect ratio of the lower electrode 144 may be increased, a leaning of the lower electrode 144 may be prevented.

Figure 9:
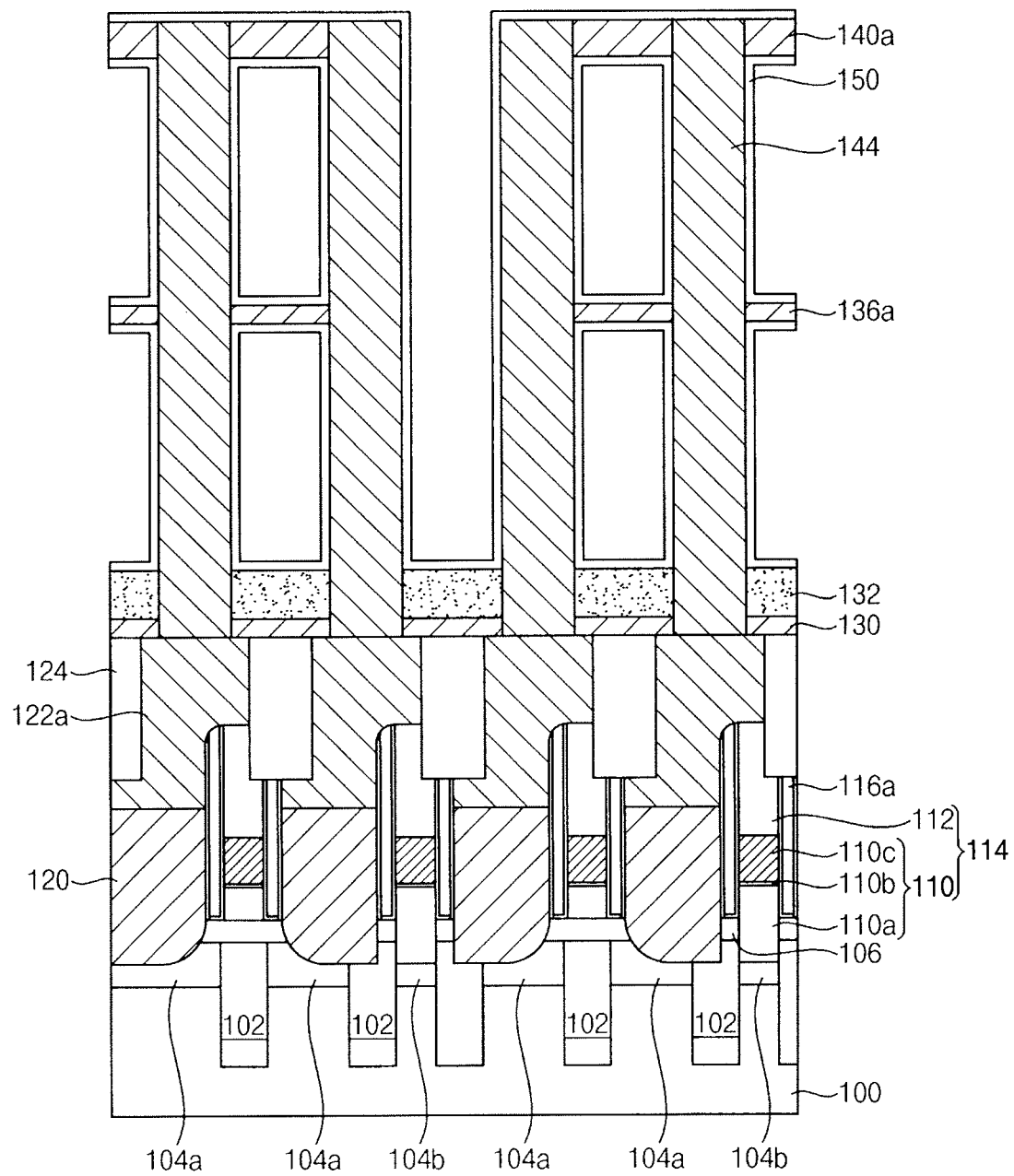

Referring to FIG. 9, a dielectric layer 150 may be conformally formed on surfaces of the lower electrode 144, the first and second support patterns 136a and 140a, and the hydrogen supply layer 132.

Thus, at least a portion of the dielectric layer 150 may be formed on an upper surface of the hydrogen supply layer 132. For example, the hydrogen supply layer 132 may be lower than the dielectric layer 150 with respect to the surface of the substrate 100.

Referring again to FIG. 1, an upper electrode 152 may be formed on the dielectric layer 150. The upper electrode 152 may be formed to fill a gap between the lower electrodes 144.

Thus, the capacitor 160 including the lower electrode 144, the dielectric layer 150, and the upper electrode 152 stacked may be formed. Then, insulating interlayers and upper metal wirings may be further formed on the capacitor 160.

The hydrogen included in the hydrogen supply layer 132 may be diffused by heat generated in subsequent processes after forming the hydrogen supply layer 132. Thus, the hydrogen may be transferred to the substrate 100 through the pad patterns 122a and contact plug 120. Therefore, dangling bonds or trap sites at the surface portion of the substrate 100 or a gate insulation layer of the transistor may be reduced by the hydrogen. In addition, defects such as crystallization of the dielectric layer 150 of the capacitor 160 may be reduced by supplying the hydrogen to the surface portion of the substrate 100 from the hydrogen supply layer 132.

Further, the hydrogen supply layer 132 may have a uniform thickness. Therefore, a storage capacitance of the capacitor 160 may be uniform according to the positions, and the semiconductor device may have uniform electrical characteristics.

Figure 10:
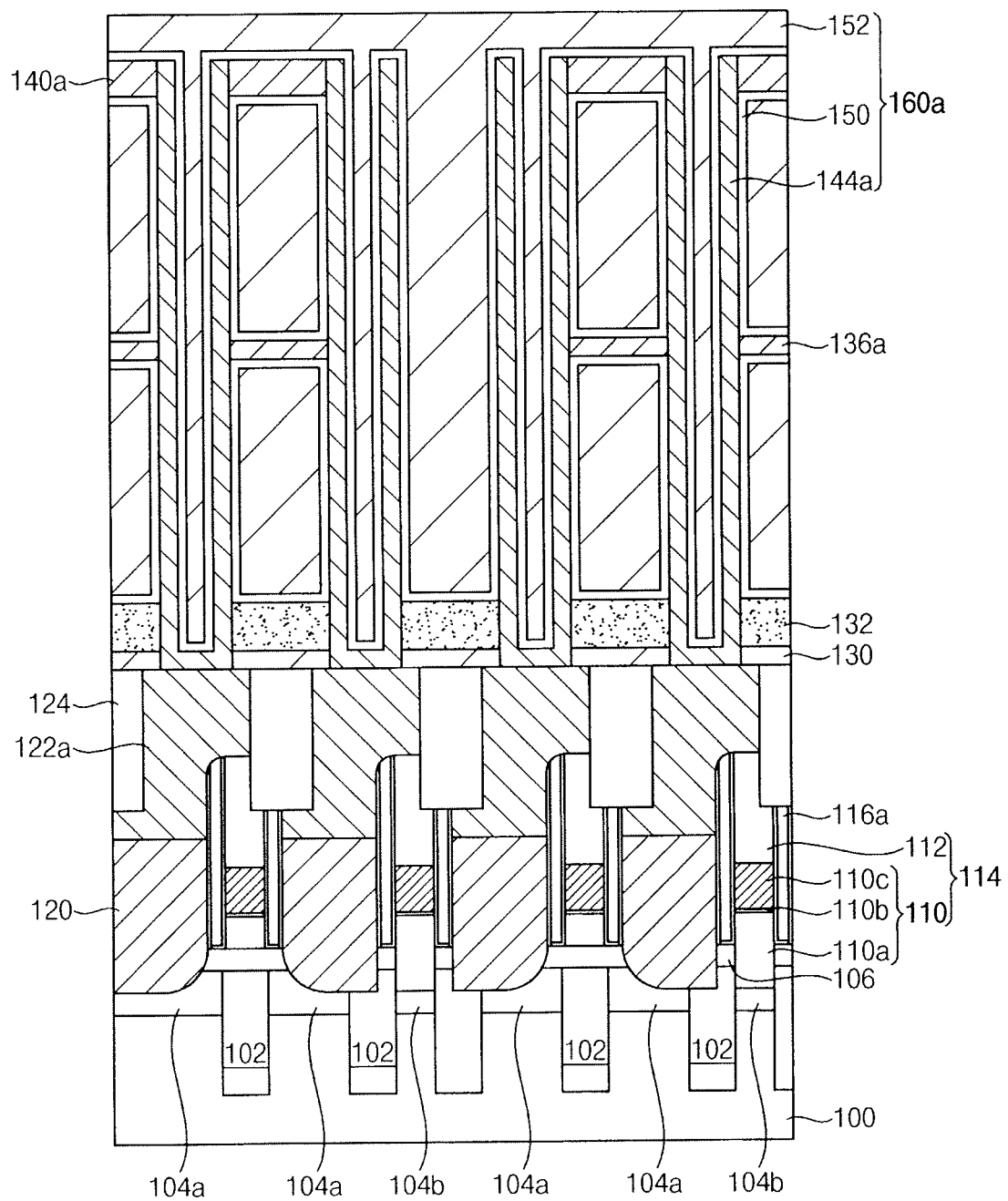
FIG. 10 illustrates a cross-sectional view of a semiconductor device in accordance with example embodiments.

FIG. 10 illustrates a cross-sectional view of a semiconductor device in accordance with example embodiments.

The semiconductor device shown in FIG. 10 may be substantially the same as the semiconductor device shown in FIG. 1, except for shapes of a lower electrode and a dielectric layer.

Referring to FIG. 10, the lower electrode 144a may have a cylindrical shape having an inner space. Thus, the dielectric layer 150 may be conformally formed on an inner surface and outer surface of the lower electrode 144a, the first and second support patterns 136a and 140a, and the hydrogen supply layer 132.

Figure 11:
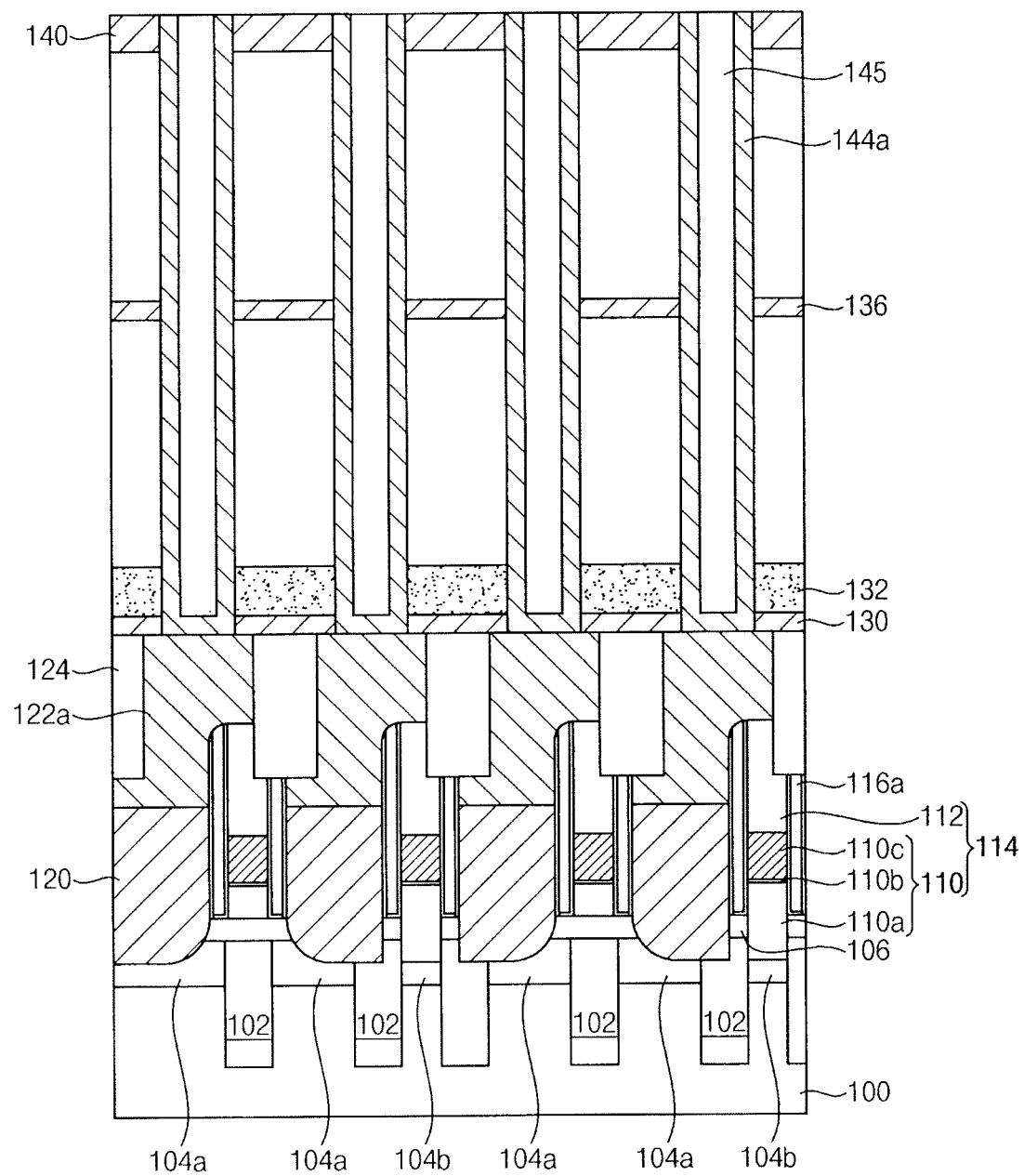
FIG. 11 illustrates a cross-sectional view of a stage in a method of manufacturing a semiconductor device in accordance with example embodiments.

FIG. 11 illustrates a cross-sectional view of a stage in a method of manufacturing a semiconductor device in accordance with example embodiments.

First, processes substantially the same as or similar to those illustrated with reference to FIGS. 2 to 5 may be performed.

Referring to FIG. 11, an etch mask may be formed on the second support layer 140. The second support layer 140, the second mold layer 138, the first support layer 136, the first mold layer 134, the hydrogen supply layer 132 and the etch stop layer 130 may be sequentially etched to form openings exposing the top surfaces of the pad patterns 122a.

The lower electrode 144a having a cylindrical shape and a filling insulation pattern 145 may be formed in the openings. In an implementation, a lower electrode layer may be conformally formed on an inner surface of the opening and an upper surface of the second support layer 140. A filling insulation layer may be formed on the lower electrode layer to fill the opening. The filling insulation layer may include silicon oxide. The lower electrode layer and the filling insulation layer may be planarized until an upper surface of the second support layer 140 may be exposed to form the lower electrode 144a and the filling insulation pattern 145.

Then, the processes illustrated with reference to FIGS. 7 to 9 may be performed in the same manner. In this case, when the second mold layer 138 and the first mold layer 134 are removed by the wet etching process, the filling insulation pattern 145 may be removed together. Thus, the semiconductor device shown in FIG. 10 may be manufactured by performing the above processes.

Figure 12:
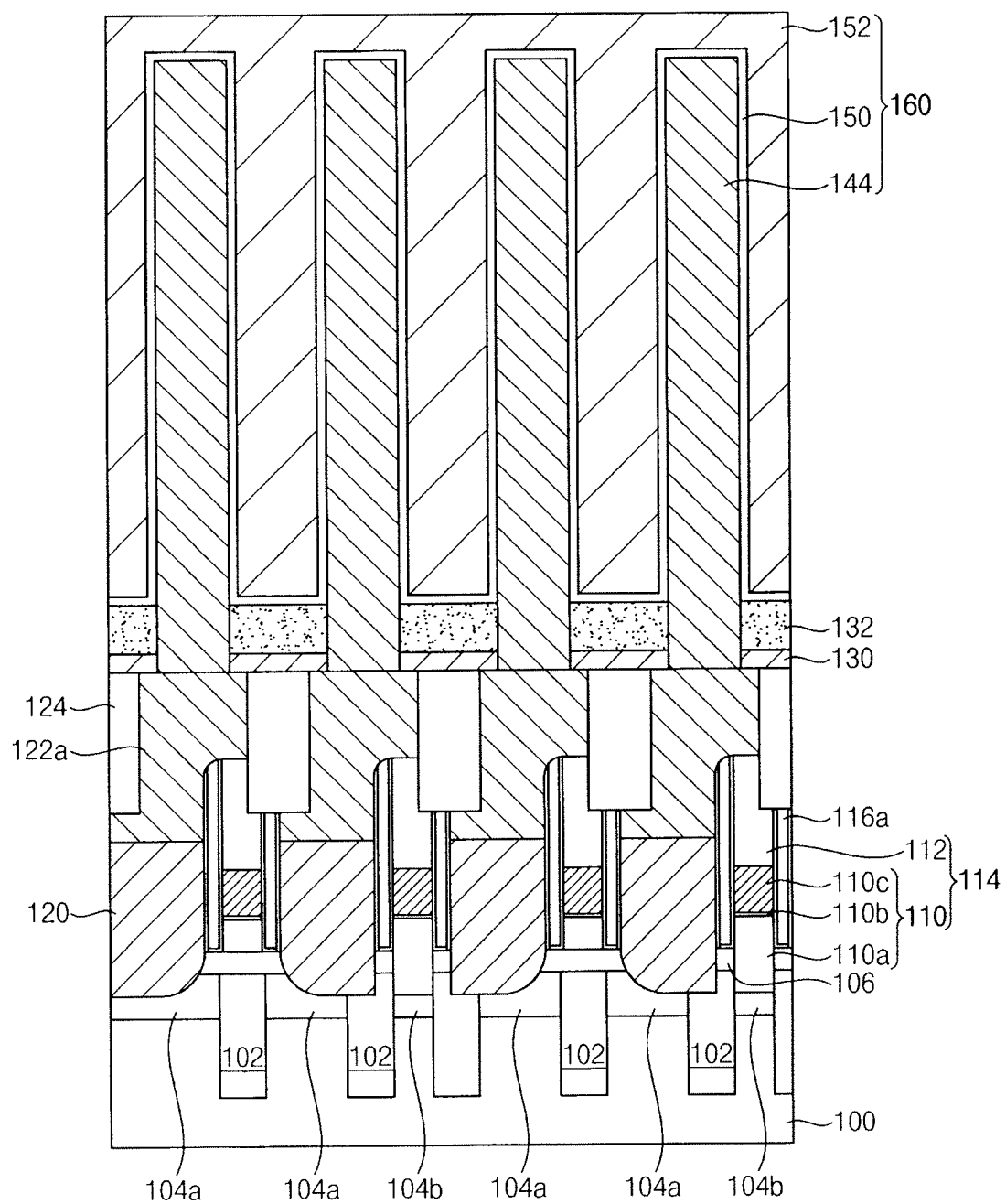
FIG. 12 illustrates a cross-sectional view of a semiconductor device in accordance with example embodiments.

FIG. 12 illustrates a cross-sectional view of a semiconductor device in accordance with example embodiments.

The semiconductor device shown in FIG. 12 may be substantially the same as the semiconductor device shown in FIG. 1, except for not including first and second support patterns.

Referring to FIG. 12, in the semiconductor device, the dielectric layer 150 may be conformally formed on surfaces of the lower electrode 144 and the hydrogen supply layer 132.

As shown in FIG. 12, the lower electrode 144 may have a pillar shape. In an implementation, the lower electrode may have a cylindrical shape similar to that shown in FIG. 10.

Figure 13:
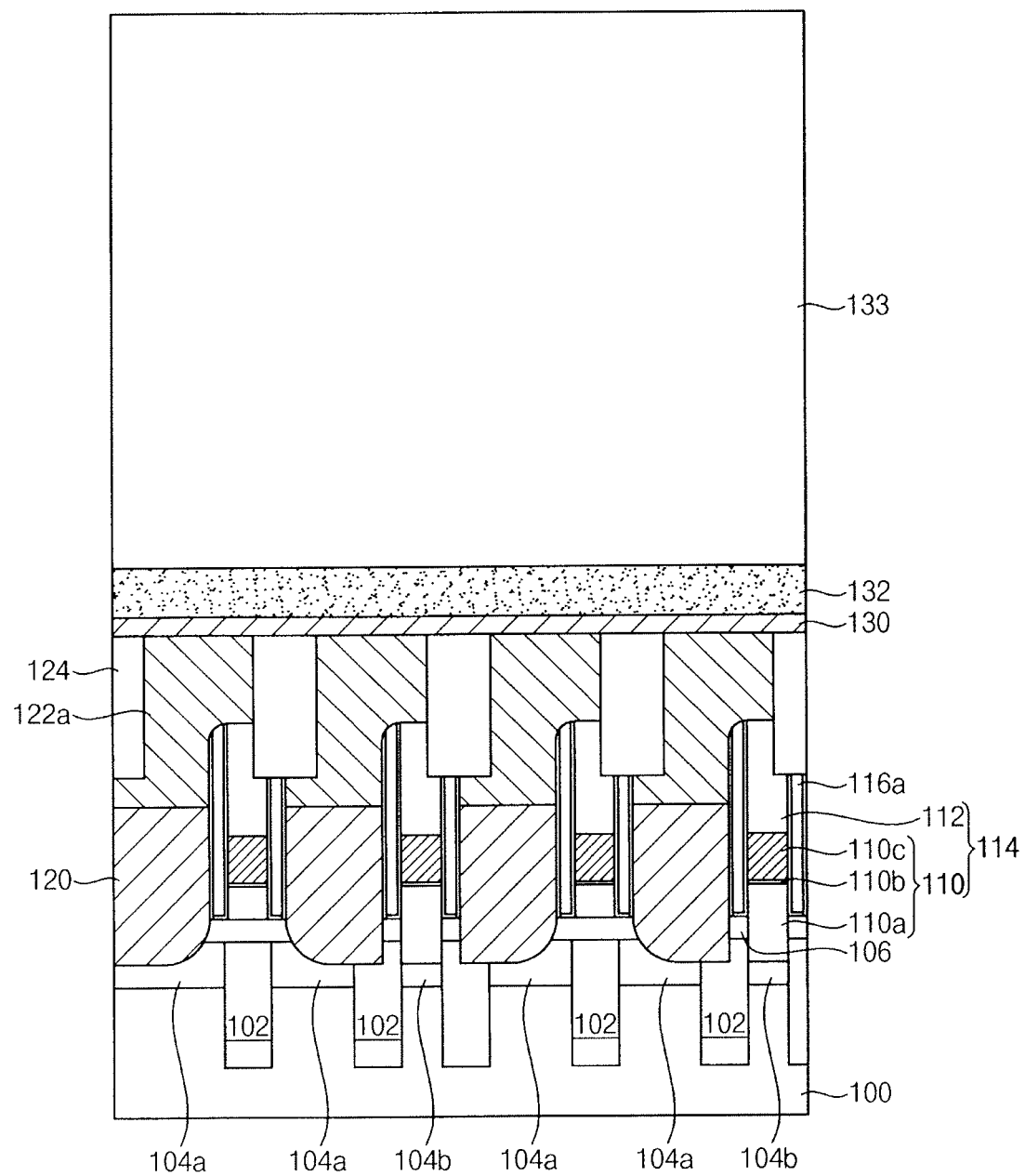
FIG. 13 illustrates a cross-sectional view of a stage in a method of manufacturing a semiconductor device in accordance with example embodiments.

FIG. 13 illustrates a cross-sectional view of a stage in a method of manufacturing a semiconductor device in accordance with example embodiments.

First, processes substantially the same as or similar to those illustrated with reference to FIGS. 2 to 4 may be performed Referring to FIG. 13, the etch stop layer 130 may be formed on the pad patterns 122a and the upper insulation pattern 124. The hydrogen supply layer 132 and the first mold layer 133 may be sequentially formed on the etch stop layer 130. For example, the first support layer, the second mold layer, and the second support layer may not be formed.

Thereafter, processes substantially the same as or similar to those illustrated with reference to FIGS. 6 to 9 may be performed, so that the semiconductor device shown in FIG. 13 may be manufactured. However, as the first and second support layers may not be formed, a process for forming the first and second holes by removing parts of the first and second support layers may not be performed. Thus, after forming the lower electrode 144, the first mold layer 133 may be completely removed by a single wet etching process.

Figure 14:
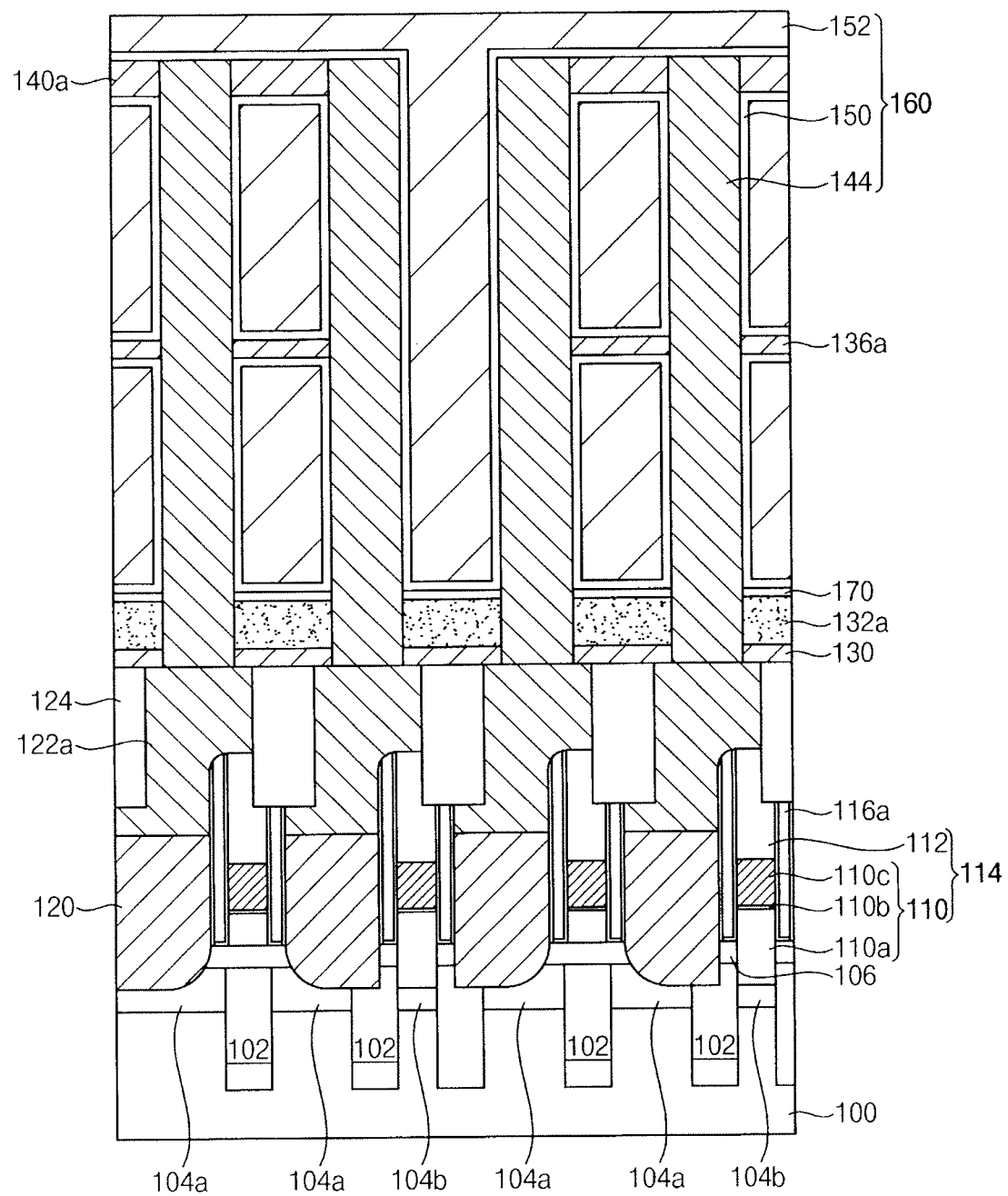
FIG. 14 illustrates a cross-sectional view of a semiconductor device in accordance with example embodiments.

FIG. 14 illustrates a cross-sectional view of a semiconductor device in accordance with example embodiments.

The semiconductor device shown in FIG. 14 may be substantially the same as the semiconductor device shown in FIG. 1, except for the hydrogen supply layer and the second etch stop layer.

Referring to FIG. 14, the semiconductor device may include the lower structure formed on the substrate 100. The first etch stop layer 130, the hydrogen supply layer 132a, the second etch stop layer 170, the first and second support patterns 136a, and 140a, and the capacitor 160 may be formed on the lower structure.

The lower structure may be substantially the same as that illustrated with reference to FIG. 1.

The first etch stop layer 130 may be formed on the pad patterns 122a and the upper insulation pattern 124.

When the mold layers are dry etched to form openings, the first etch stop layer 130 may serve as a stop layer. Thus, the first etch stop layer 130 may include an insulation material having a high etching selectivity with respect to silicon oxide in the dry etching process. In an implementation, the first etch stop layer 130 may include silicon nitride, SiCN, SiBN, SiON, or the like. The first etch stop layer 130 may be substantially the same as the etch stop layer illustrated with reference to FIG. 1.

The hydrogen supply layer 132a and the second etch stop layer 170 may be sequentially formed on the first etch stop layer 130. The second etch stop layer 170 may cover an upper surface of the hydrogen supply layer 132a.

The hydrogen supply layer 132a may include a hydrogen rich oxide including hydrogen, and may be an insulation material. The hydrogen supply layer 132a may have a uniform thickness depending on positions thereof.

In an implementation, when the mold layers are wet etched, the second etch stop layer 170 may serve as a stop layer in the wet etching process. In the wet etching process for removing the mold layers, the hydrogen supply layer 132a may be not exposed, so that etchant used in the wet etching process may not contact the hydrogen supply layer 132a. Therefore, when selecting a material to be included in the hydrogen supply layer 132a, an etching rate with respect to the etchant of the silicon oxide may not be considered. For example, the hydrogen supply layer 132a may be formed of the material having a high etching rate with respect to the etchant of the silicon oxide. In an implementation, the hydrogen supply layer 132a may include a silicon oxide including hydrogen.

In an implementation, the hydrogen supply layer 132a may be an oxide layer formed at a low temperature of 400° C. or lower. For example, the hydrogen supply layer may include flowable oxide (FOX), Tonen SilaZen (TOSZ), undoped silica glass (USG), borosilica glass (BSG), phosphosilica glass (PSG), borophosphosilicate glass (BPSG), Plasma Enhanced Tetra Ethyl Ortho Silicate (PE-TEOS), Fluoride Silicate Glass (FSG), PE-oxide, or the like.

The second etch stop layer 170 may include an insulation material having a low etching rate with respect to the etchant of silicon oxide. If the second etch stop layer 170 were to have a great thickness, 'not open failure' that the pad pattern 122a may not be exposed at a bottom of the opening in forming the opening by a dry etching of the mold layers, could occur. In addition, an area for depositing of the dielectric layer 150 could be decreased, and thus a storage capacitance of the capacitor could be decreased. In an implementation, the second etch stop layer 170 may have a thin thickness. In an implementation, the thickness of the second etch stop layer 170 may be less than a thickness of the first etch stop layer 130.

In an implementation, the etching rate of the second etch stop layer 170 for the etchant of silicon oxide may be lower than the etching rate of silicon nitride (SiN) for the etchant of the silicon oxide. In an implementation, the second etch stop layer 170 may include SiCN, SiBN, or the like.

The capacitor 160 may have the lower electrode 144, the dielectric layer 150, and the upper electrode 152 stacked. The lower electrode 144 may be formed on the upper surface of the pad pattern 122a through the second etch stop layer 170, the hydrogen supply layer 132a and the first etch stop layer 130. Thus, the hydrogen supply layer 132a may be formed between the lower electrodes 144. The hydrogen supply layer 132a may contact a lower sidewall of the lower electrode 144.

In an implementation, the lower electrode 144 may have a pillar shape.

Each of the first and second support patterns 136a and 140a may contact the sidewalls of portions of the lower electrodes 144, so that the lower electrodes 144 may be supported by the first and second support patterns 136a and 140a. Thus, a leaning of the lower electrodes 144 may be prevented.

The dielectric layer 150 may be conformally formed on a surface of the lower electrode 144, the surfaces of the first and second support patterns 136a and 140a, and the second etch stop layer 170. In an implementation, the dielectric layer 150 may not contact the first etch stop layer 130, and may be higher than an upper surface of the first etch stop layer 130. In an implementation, the dielectric layer 150 may contact an upper surface of the second etch stop layer 170.

The upper electrode 152 may be formed on the dielectric layer 150.

Therefore, the hydrogen supply layer 132a may be lower than a bottom of the bit line structure 114, and may be lower than the dielectric layer 150 of the capacitor 160.

Figure 15:
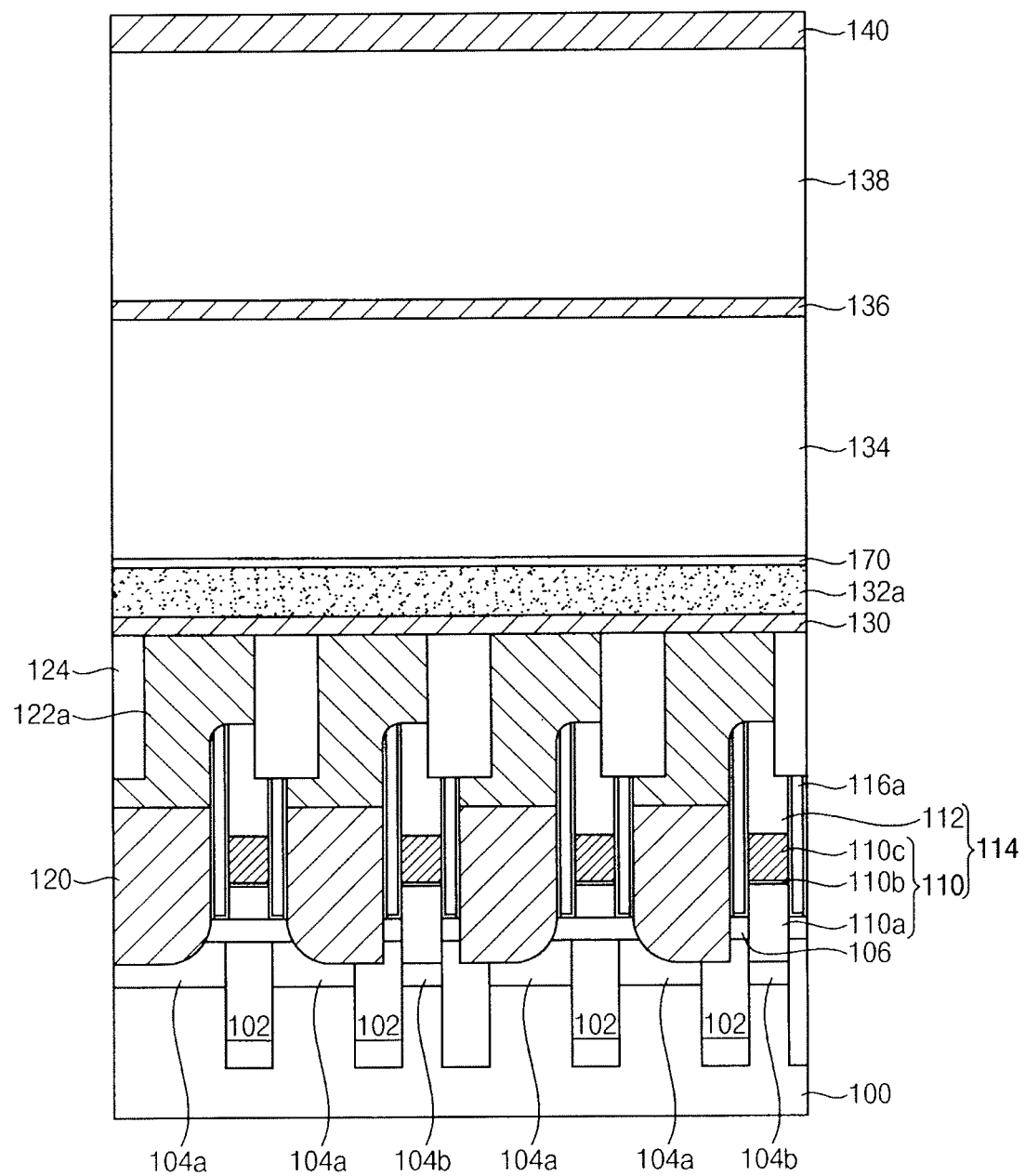
FIGS. 15 to 17 illustrate cross-sectional views of stages in a method of manufacturing a semiconductor device in accordance with example embodiments.
Figure 16:
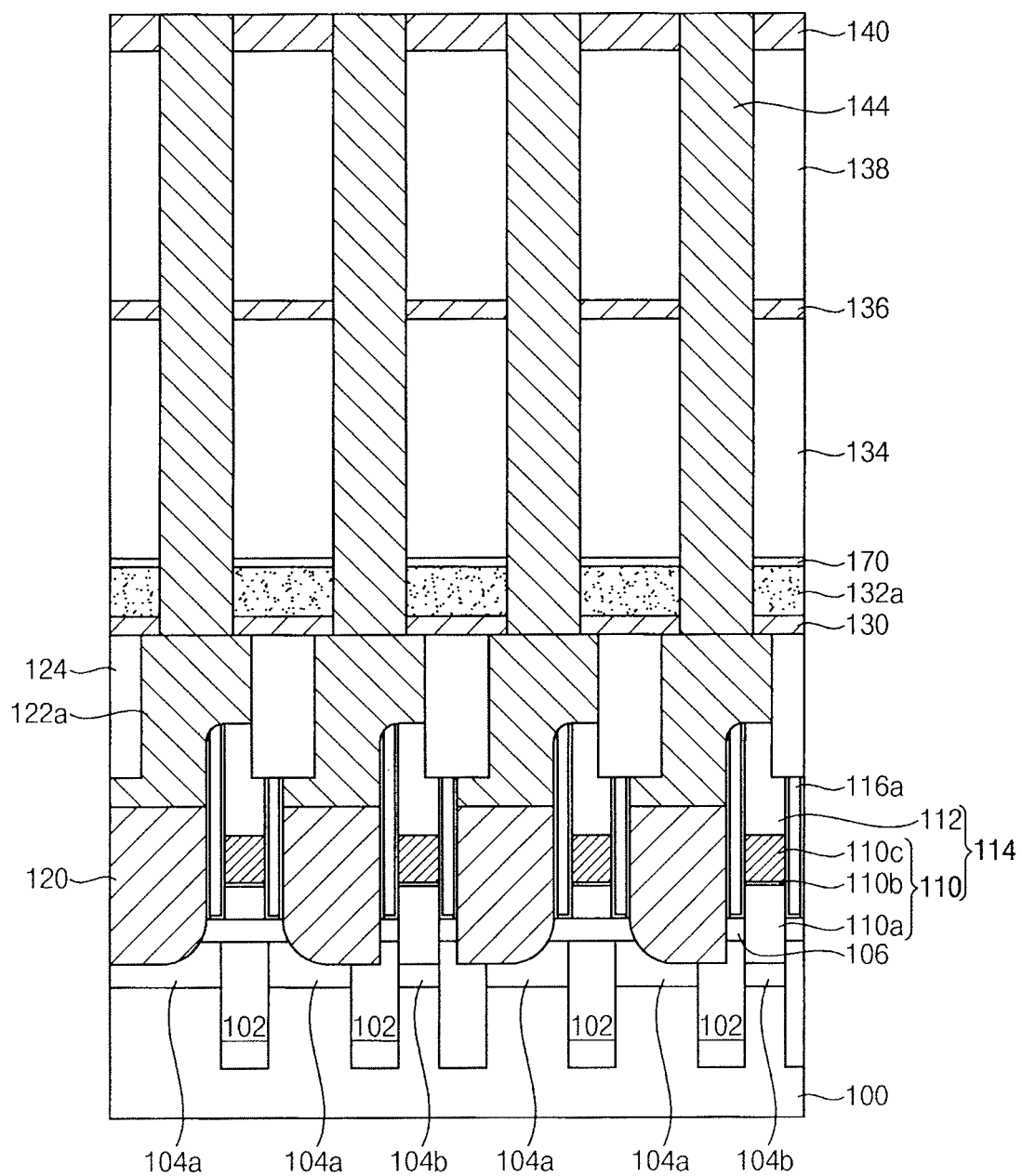
Figure 17:
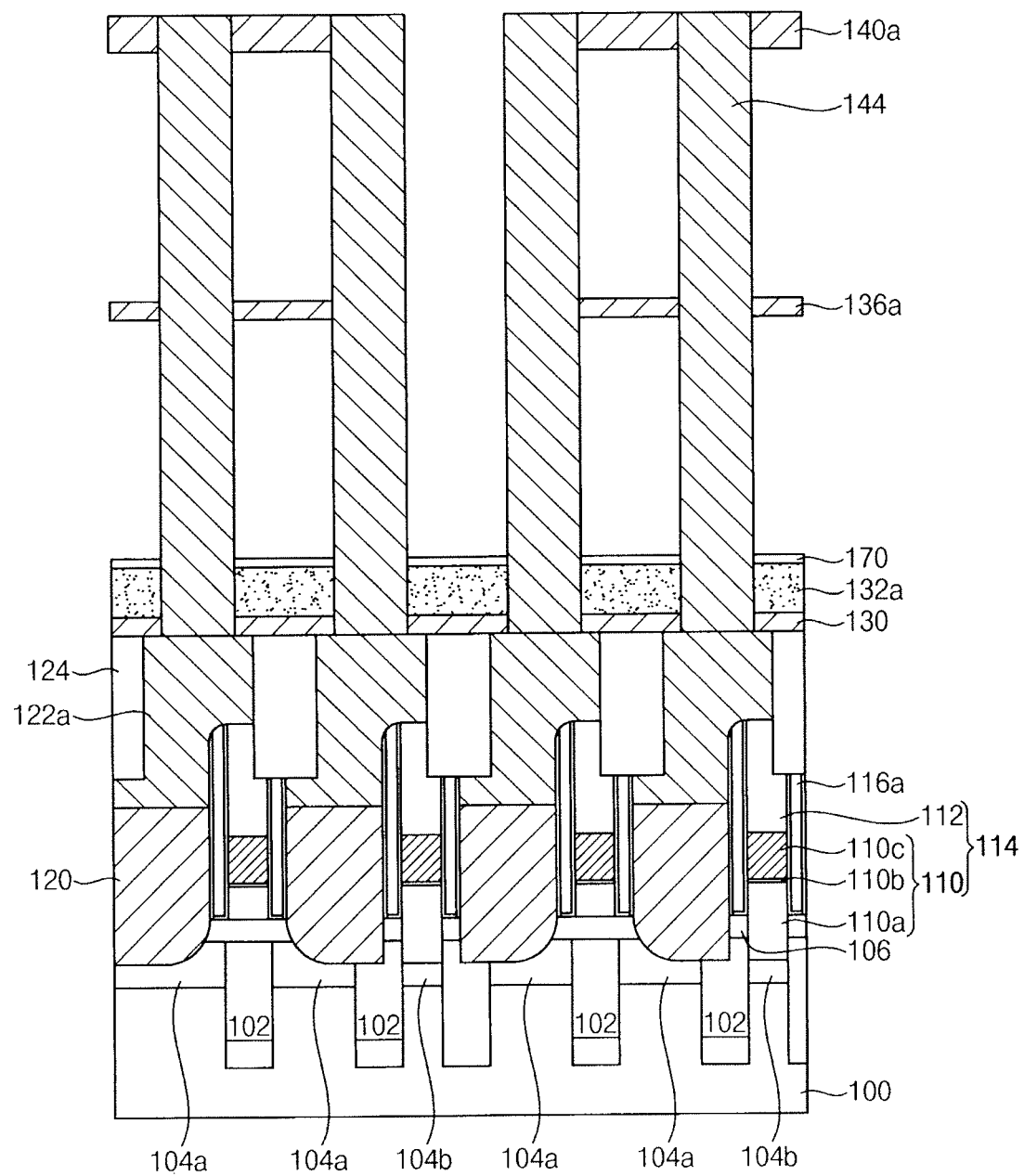

FIGS. 15 to 17 illustrate cross-sectional views of stages in a method of manufacturing a semiconductor device in accordance with example embodiments.

First, processes substantially the same as or similar to those illustrated with reference to FIGS. 2 to 4 may be performed Referring to FIG. 15, the first etch stop layer 130 may be formed on the pad patterns 122a and the upper insulation pattern 124. Then, the hydrogen supply layer 132a, the second etch stop layer 170, the first mold layer 134, the first support layer 136, the second mold layer 138, and the second support layer 140 may be sequentially formed on the first etch stop layer 130.

In an implementation, the second etch stop layer 170 may include SiCN or SiBN. In an implementation, the hydrogen supply layer 132a may include a silicon oxide including hydrogen. The hydrogen supply layer 132a may be formed at a low temperature of 400° C. or lower. In an implementation, the hydrogen supply layer 132a may be formed by a low-temperature plasma process at 400° C. or lower.

In an implementation, the hydrogen supply layer 132a and the second etch stop layer 170 may be formed by in-situ process.

Referring to FIG. 16, the second support layer 140, the second mold layer 138, the first support layer 136, the first mold layer 134, the second etch stop layer 170, the hydrogen supply layer 132a, and the first etch stop layer 130 may be sequentially etched to form openings exposing upper surfaces of the pad patterns 122a. The lower electrode 144 may be formed in each of the openings. In an implementation, the lower electrode 144 may have a pillar shape.

Referring to FIG. 17, portions of the second support layer 140 may be etched to form first holes exposing upper portions of the second mold layer 138. Thus, the second support pattern 140a may be formed. Thereafter, the second mold layer 138 may be wet etched by supplying the etchant of silicon oxide through the first holes.

Portions of the first support layer 136 may be etched to form second holes exposing upper portions of the first mold layer 134. Thus, the first support pattern 136a may be formed. Thereafter, the first mold layer 134 may be wet etched by supplying the etchant of silicon oxide through the second holes.

When the wet etching processes are performed, the second etch stop layer 170 may be exposed, and the hydrogen supply layer 132a may not be exposed. Thus, the hydrogen supply layer 132a may not be damaged or consumed during the wet etching processes. Therefore, the hydrogen supply layer 132a may be maintained after the wet etching processes, so that the hydrogen supply layer 132a may have a uniform thickness depending on the positions thereof.

Also, the second etch stop layer 170 on the hydrogen supply layer 132a may serve as a diffusion barrier layer for preventing the hydrogen included in the hydrogen supply layer 132a from a diffusing upwardly (e.g., away from the substrate 100). Thus, defects that could otherwise occur due to the diffusing of the hydrogen included in the hydrogen supply layer 132a may be reduced or prevented.

Referring to FIG. 14 again, the dielectric layer 150 may be conformally formed on a surface of the lower electrode 144, surfaces of the first and second support patterns 136a and 140a, and a surface of the second etch stop layer 170. The upper electrode 152 may be formed on the dielectric layer 150. The processes may be substantially the same as those illustrated with reference to FIG. 9 and FIG. 1. Thus, the semiconductor device shown in FIG. 14 may be manufactured by performing the processes.

Figure 18:
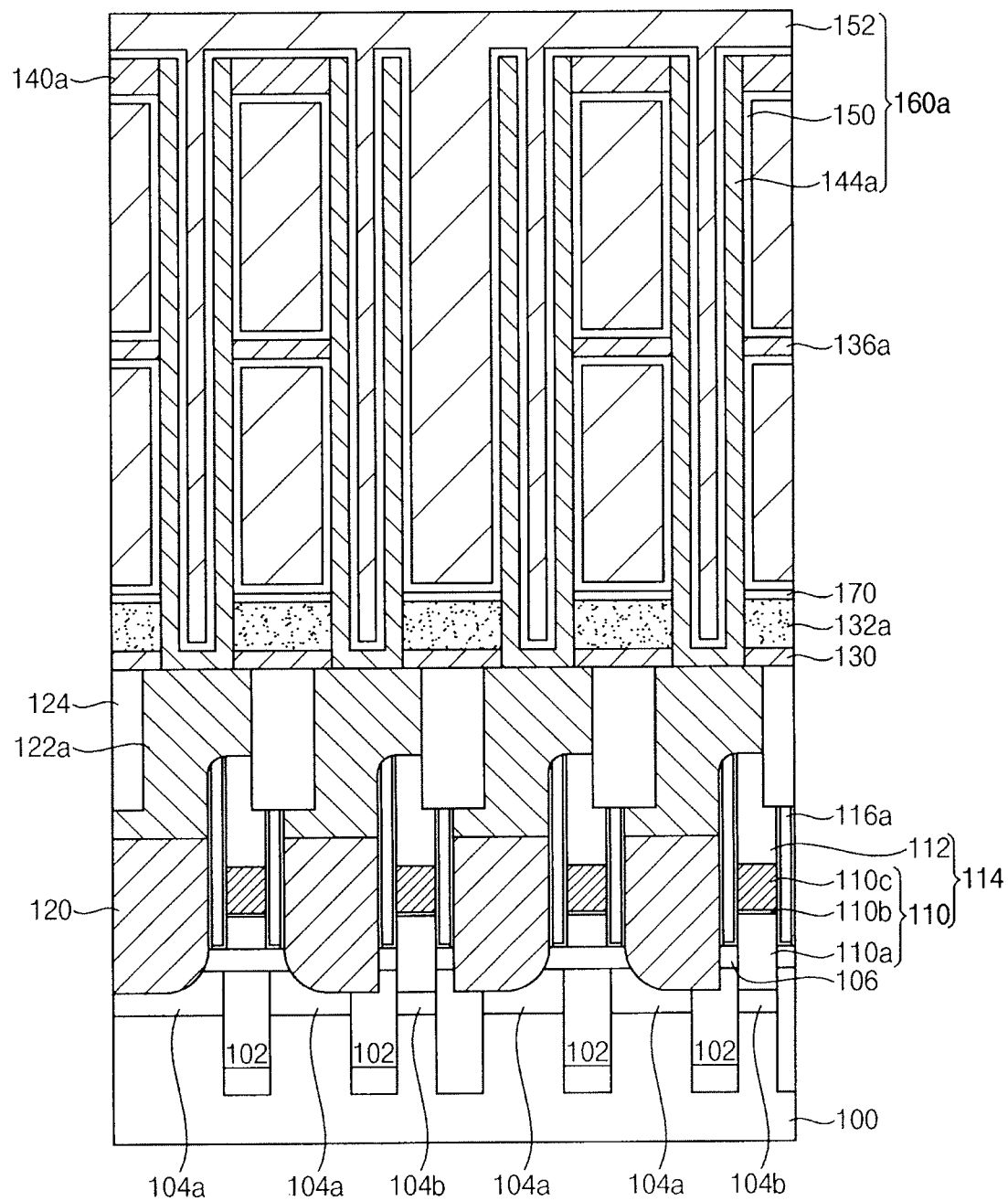
FIG. 18 illustrates a cross-sectional view of a semiconductor device in accordance with example embodiments.

FIG. 18 illustrates a cross-sectional view of a semiconductor device in accordance with example embodiments.

The semiconductor device shown in FIG. 18 may be substantially the same as the semiconductor device shown in FIG. 14, except for shapes of the lower electrode and the dielectric layer.

Referring to FIG. 18, the lower electrode 144a may have a cylindrical shape having an inner space. Thus, the dielectric layer 150 may be formed on inner and outer surfaces of the lower electrode 144a, the first and second support patterns 136a and 140a, and the second etch stop layer 170.

Figure 19:
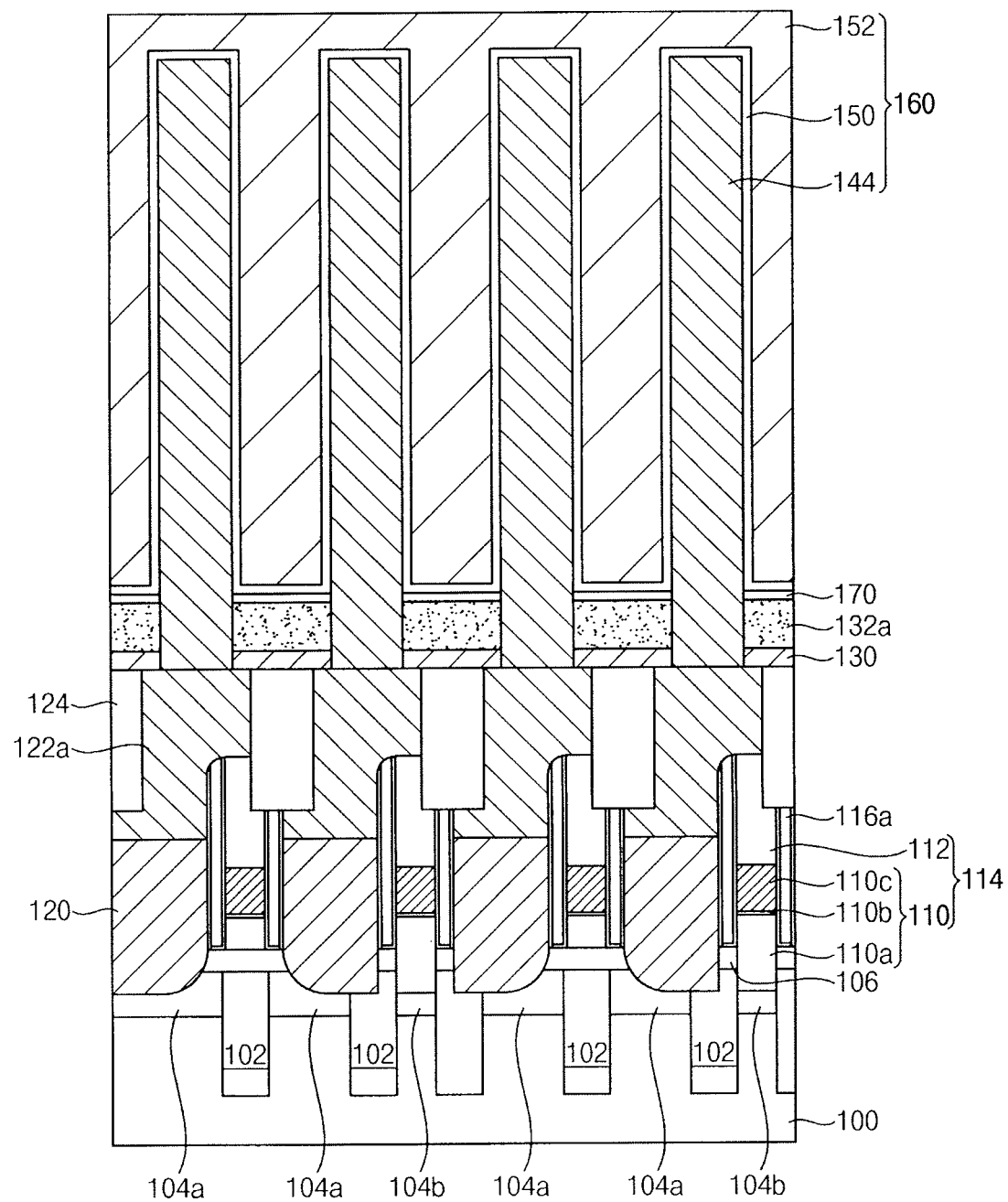
FIG. 19 illustrates a cross-sectional view of a semiconductor device in accordance with example embodiments.

FIG. 19 illustrates a cross-sectional view of a semiconductor device in accordance with example embodiments.

The semiconductor device shown in FIG. 19 may be substantially the same as the semiconductor device shown in FIG. 14, except for not including first and second support patterns.

Referring to FIG. 19, in the semiconductor device, the dielectric layer 150 may be conformally formed on surfaces of the lower electrode 144 and the second etch stop layer 170. As shown in FIG. 14, the lower electrode 144 may have a pillar shape. In an implementation, the lower electrode may have a cylindrical shape similar to that shown in FIG. 18.

Figure 20:
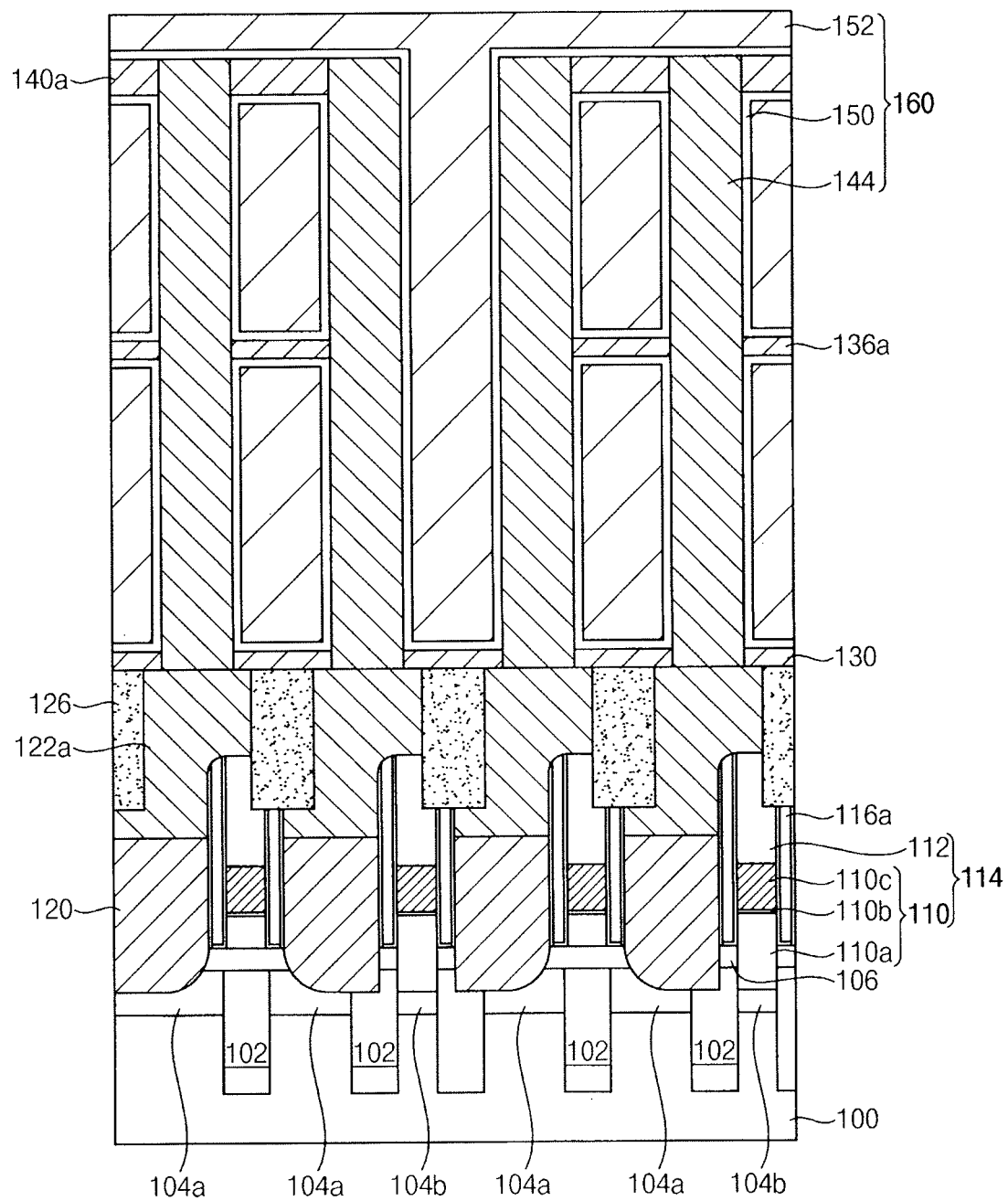
FIG. 20 illustrates a cross-sectional view of a semiconductor device in accordance with example embodiments.

FIG. 20 illustrates a cross-sectional view of a semiconductor device in accordance with example embodiments.

Referring to FIG. 20, the semiconductor device may include the lower structure on a substrate 100. The etch stop layer 130, the first and second support patterns 136a and 140a, and the capacitor 160 may be on the lower structure.

The lower structure may include, e.g., a transistor, a bit line structure 114, a contact plug 120, pad patterns 122a, and a hydrogen supply pattern 126. Upper surfaces of the pad patterns 122a and the hydrogen supply pattern 126 may correspond to an uppermost surface of the lower structure. Also, the hydrogen supply pattern 126 may fill a space between the pad patterns 122a.

In an implementation, the lower structure may be similar to or the same as the lower structure illustrated with reference to FIG. 1, except that an upper insulation pattern (124 of FIG. 1) may be replaced by the hydrogen supply pattern 126.

The hydrogen supply pattern 126 may contact at least a portion of the first mask pattern 112 in the bit line structure 114. The hydrogen supply pattern 126 may not be damaged or removed by the etchant in the wet etching process for removing the mold layers. Thus, the hydrogen supply pattern 126 may have a low etching rate with respect to the etchant of silicon oxide.

Also, the hydrogen supply pattern 126 may include a large amount of hydrogen. Thus, the hydrogen supply pattern 126 may include a hydrogen rich oxide including hydrogen, and may be an insulation material.

In an implementation, the hydrogen supply pattern 126 may be an oxide including carbon, e.g., SiOCH or SiOC. If the hydrogen supply pattern 126 were to be deposited at a temperature of 400° C. or higher, covalent hydrogen bonds, e.g., Si—H bonds, included in layers, could be mostly removed during the deposition process. In an implementation, the hydrogen supply pattern 126 may be deposited at a temperature of 400° C. or less.

Silicon nitride (SiN) may have low hydrogen content, and silicon oxide (SiO$_2$) may be removed by the etchant of the silicon oxide (e.g., used during subsequent steps of manufacturing the device). For example, silicon nitride and silicon oxide may not be suitable as materials for the hydrogen supply pattern 126.

An air spacer 116a may be formed on a sidewall of the bit line structure 114. The air spacers 116a may be positioned under a bottom of the hydrogen supply pattern 126.

The etch stop layer 130 may be formed on the lower structure. The etch stop layer 130 may be formed on the pad patterns 122a and the hydrogen supply pattern 126. For example, the etch stop layer 130 may cover the upper surface of the hydrogen supply pattern 126.

The capacitor 160 may include the lower electrode 144, the dielectric layer 150, and the upper electrode 152 stacked. The lower electrode 144 may be formed on an upper surface of the pad pattern 122a (e.g., passing through the etch stop layer 130). For example, the hydrogen supply pattern 126 may be lower than the capacitor 160. The hydrogen supply pattern 126 may be between the lower electrodes 144 (e.g., in a plan view).

In an implementation, the lower electrode 144 may have a pillar shape.

The first and second support patterns 136a and 140a may contact sidewalls of portions of the plurality of lower electrodes 144, so that the lower electrodes 144 may be supported by the first and second support patterns 136a and 140a. For example, a leaning of the lower electrodes may be prevented.

The dielectric layer 150 may be conformally formed on the surfaces of the lower electrode 144, the first and second support patterns 136a and 140a and the etch stop layer 130.

The upper electrode 152 may be formed on the dielectric layer 150.

As described above, the hydrogen supply pattern 126 may be lower than the capacitor 160, so that a storage capacitance of the capacitor may be increased.

Figure 21:
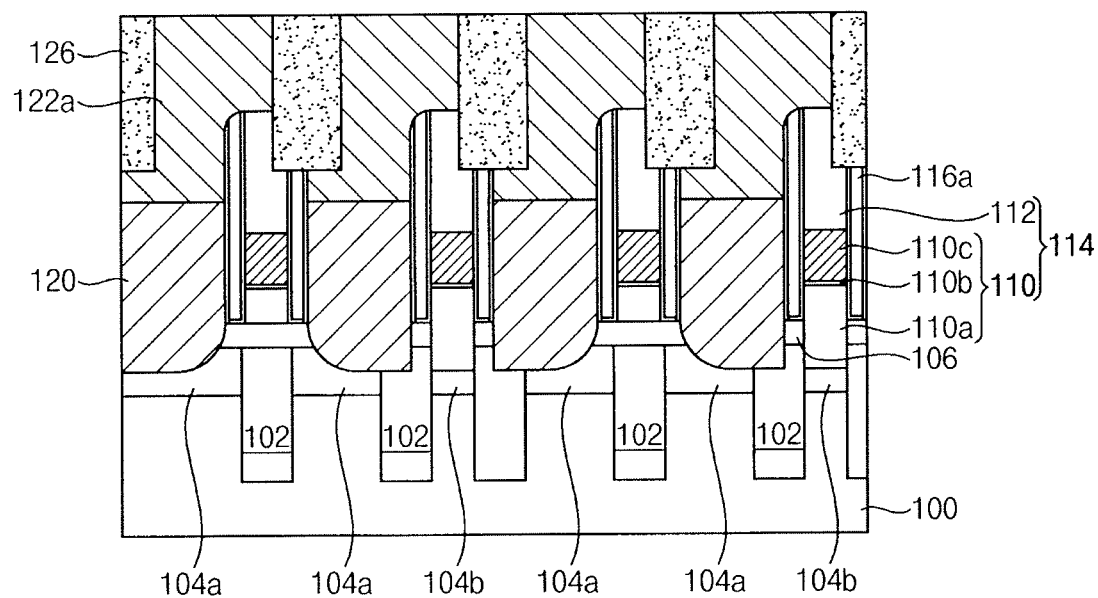
FIGS. 21 to 23 illustrate cross-sectional views of stages in a method of manufacturing a semiconductor device in accordance with example embodiments.
Figure 22:
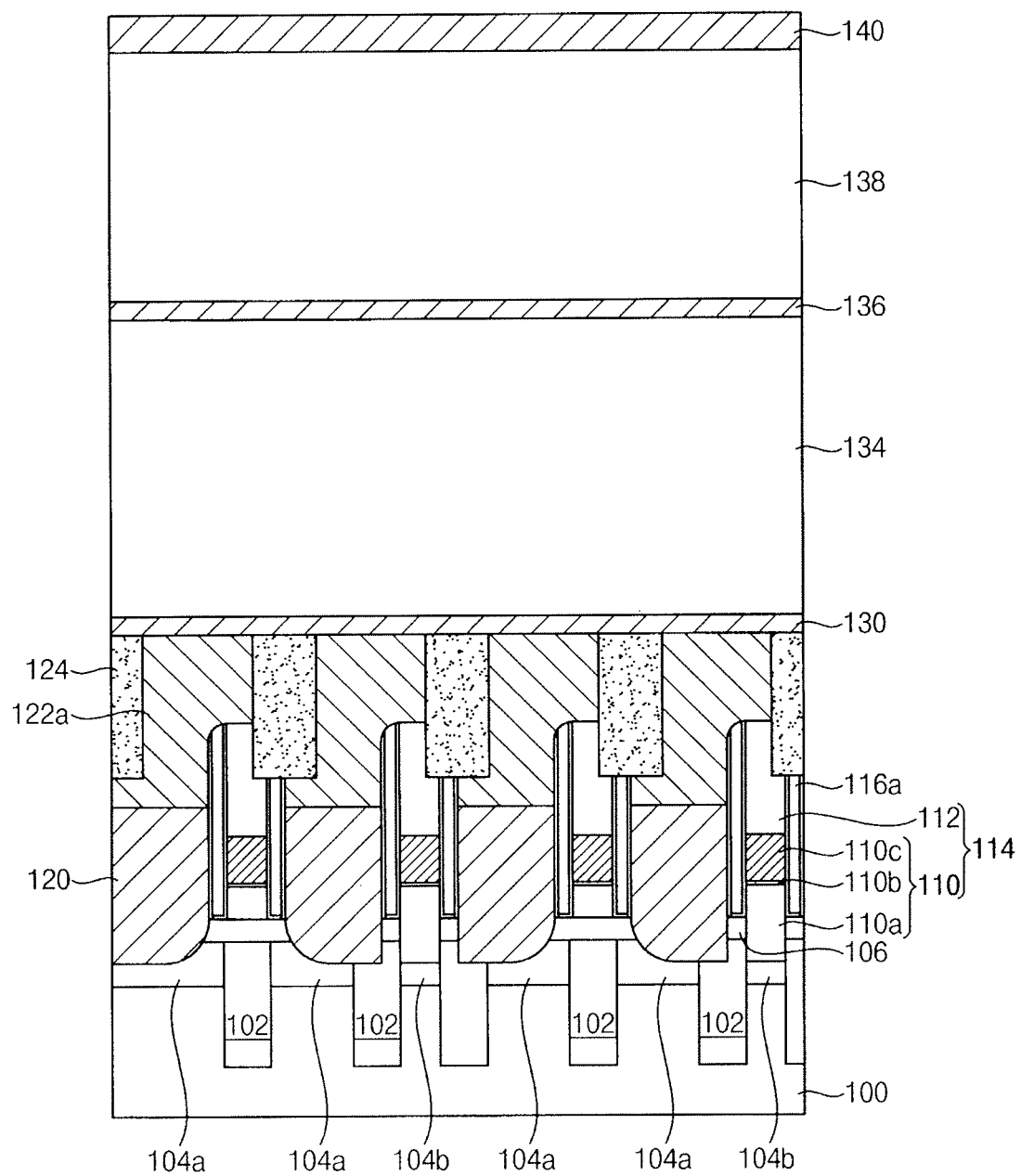
Figure 23:
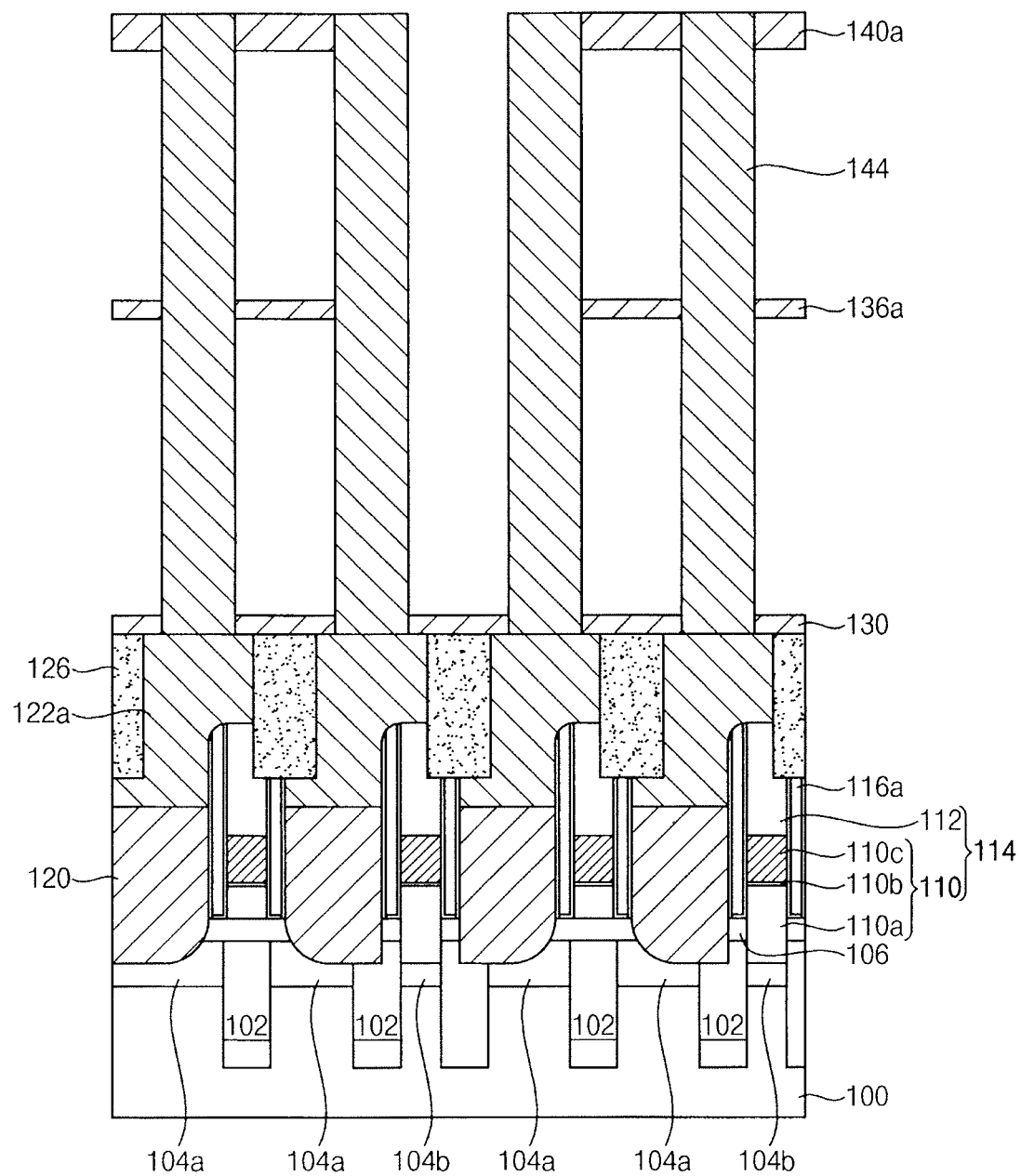

FIGS. 21 to 23 illustrate cross-sectional views of stages in a method of manufacturing a semiconductor device in accordance with example embodiments.

First, referring to FIGS. 2 and 3, a part of the lower structure may be formed on the substrate 100.

Referring to FIG. 21, the pad electrode layer may be patterned to form the pad patterns 122a. The spacer exposed by the bottom of the opening between the pad patterns 122a may be removed by a wet etching process to form an air spacer 116a. In an implementation, the spacer may not be removed, so that the spacer may include an insulation spacer.

A hydrogen supply layer may be formed to fill the space between the pad patterns 122a. The hydrogen supply layer may be planarized until upper surfaces of the pad patterns 122a are exposed to form the hydrogen supply pattern 126 between the pad patterns 122a. Thus, upper surfaces of the pad patterns 122a and the hydrogen supply pattern 126 may be coplanar with each other.

In subsequent removing process of the mold layers, the etchant of silicon oxide may be introduced into or exposed to the hydrogen supply pattern 126. At this time, the hydrogen supply pattern 126 may not be damaged or removed by the etchant. For example, the hydrogen supply pattern 126 may include a material having a low etching rate with respect to the etchant of silicon oxide.

Also, the hydrogen supply pattern 126 may include a hydrogen rich oxide including hydrogen. In an implementation, the hydrogen supply pattern 126 may include an oxide including carbon. For example, the hydrogen supply pattern 126 may include SiOCH, SiOC, or the like.

If the hydrogen supply layer were to be deposited at a temperature of 400° C. or higher, the covalent hydrogen bonds, for example Si—H bonds, included in layers, could be mostly removed during the deposition process. In an implementation, the hydrogen supply layer may be formed by a low temperature plasma deposition process at 400° C. or lower.

Referring to FIG. 22, an etch stop layer 130 may be formed on the pad patterns 122a and the hydrogen supply pattern 126. A first mold layer 134, a first support layer 136, a second mold layer 138, and a second support layer 140 may be sequentially formed on the etch stop layer 130.

Referring to FIG. 23, the second support layer 140, the second mold layer 138, the first support layer 136, the first mold layer 134, and the etch stop layer 130 may be sequentially etched to form openings exposing upper surfaces of the pad patterns 122a. The lower electrode 144 may be formed in the opening. In an implementation, the lower electrode 144 may have a pillar shape.

Thereafter, processes substantially the same as or similar to those illustrated with reference to FIGS. 7 and 8 may be performed to remove the first and second mold layers 134 and 138. Also, a first support pattern 136a and a second support pattern 140a may be formed to support the lower electrode 144. When the above processes are performed, the upper surface of the etch stop layer 130 may be exposed between the lower electrodes 144. For example, the hydrogen supply pattern 126 may be exposed to the etchant during removing the first and second mold layers 134 and 138, but the hydrogen supply pattern 126 may not be removed. Thus, the hydrogen supply pattern 126 may have a uniform thickness, after the removing the first and second mold layers 134 and 138.

Referring to FIG. 20 again, the dielectric layer 150 may be conformally formed on surfaces of the lower electrode 144, the first and second support patterns 136a and 140a, and the etch stop layer 130. The upper electrode 152 may be formed on the dielectric layer 150. Therefore, the semiconductor device shown in FIG. 20 may be manufactured.

Figure 24:
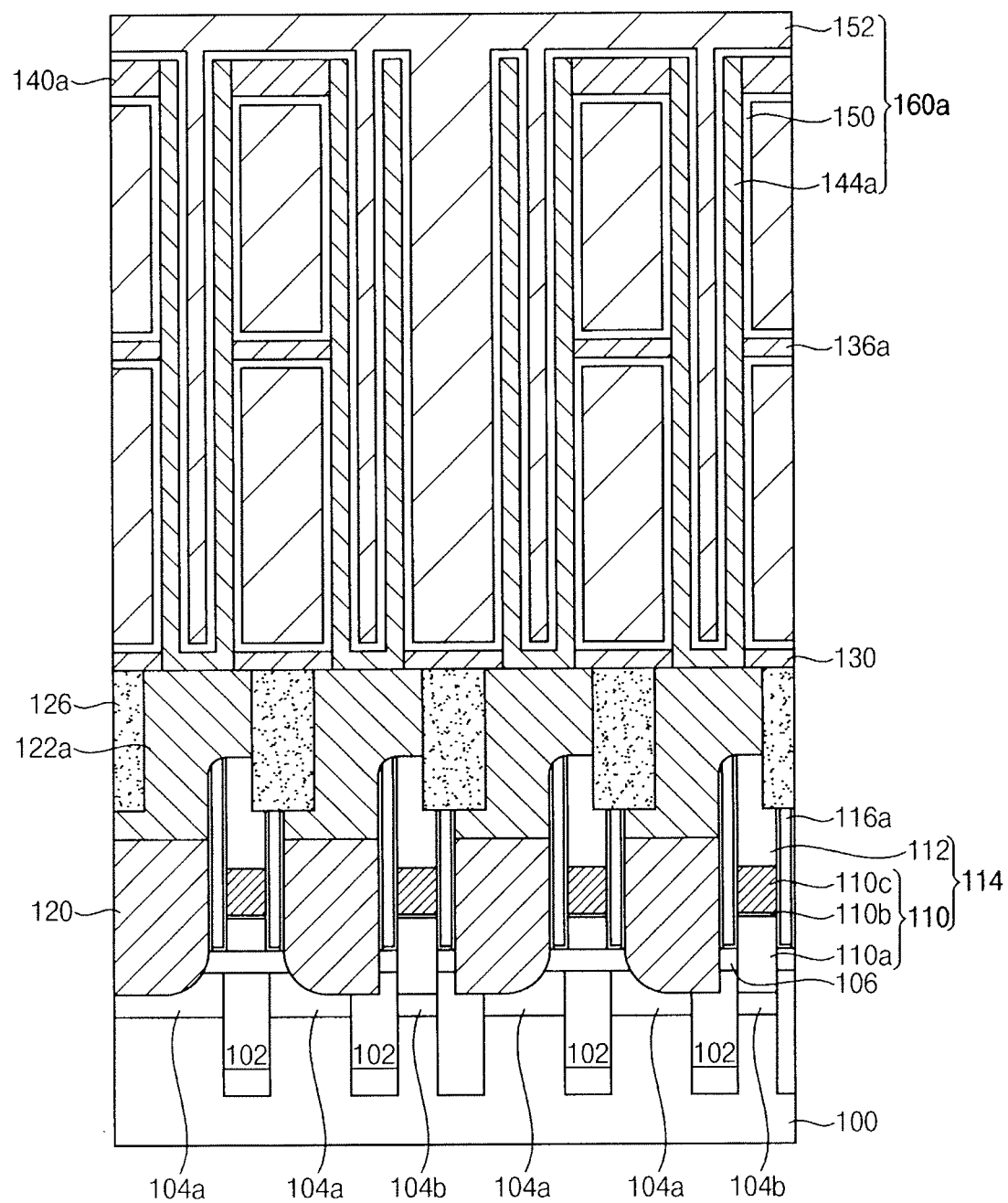
FIG. 24 illustrates a cross-sectional view of a semiconductor device in accordance with example embodiments.

FIG. 24 illustrates a cross-sectional view of a semiconductor device in accordance with example embodiments.

The semiconductor device shown in FIG. 24 may be substantially the same as the semiconductor device shown in FIG. 20, except for shapes of the lower electrode and the dielectric layer.

Referring to FIG. 24, the lower electrode 144a may have a cylindrical shape having an inner space. Thus, the dielectric layer 150 may be formed on inner and outer surfaces of the lower electrode 144a, the first and second support patterns 136a and 140a, and the etch stop layer 130.

Figure 25:
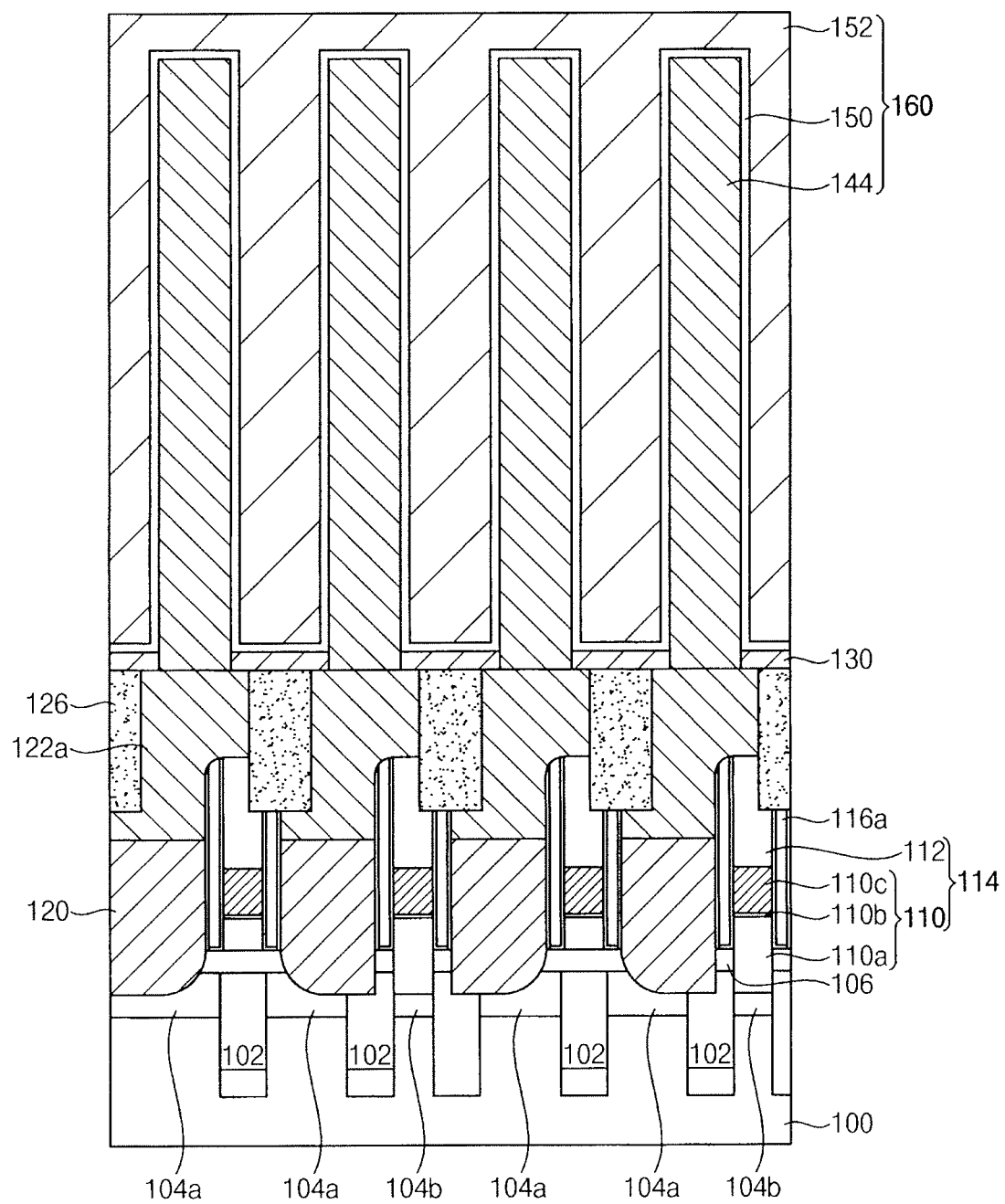
FIG. 25 illustrates a cross-sectional view of a semiconductor device in accordance with example embodiments.

FIG. 25 illustrates a cross-sectional view of a semiconductor device in accordance with example embodiments.

The semiconductor device shown in FIG. 25 may be substantially the same as the semiconductor device shown in FIG. 20, except for not including first and second supporting patterns.

Referring to FIG. 25, in the semiconductor device, the dielectric layer 150 may be formed on surfaces of the lower electrode 144 and the etch stop layer 130. As shown in FIG. 25, the lower electrode 144 may have a pillar shape. In an implementation, the lower electrode may have a cylindrical shape.

In an implementation, various semiconductor devices in accordance with example embodiments may be presented.

For example, the lower structure of the semiconductor device illustrated with reference to FIG. 1 may be replaced with the lower structure of the semiconductor device illustrated with reference to FIG. 20. For example, the hydrogen supply pattern may be included in the lower structure, and the hydrogen supply layer may be further formed on the etch stop layer.

In an implementation, the lower structure of the semiconductor device illustrated with reference to FIG. 14 may be replaced with the lower structure of the semiconductor device illustrated with reference to FIG. 20. For example, the hydrogen supply pattern may be included in the lower structure, and the hydrogen supply layer may be further formed between the first and second etch stop layers.

The semiconductor device may be applied to one of memory devices including a transistor and a capacitor.

One or more embodiments may provide a defect-free DRAM (dynamic random access memory) device and a method of manufacturing the same.

One or more embodiments may provide a method of manufacturing a semiconductor device having good characteristics.

In the semiconductor device in example embodiments, the hydrogen supply layer may be lower than the dielectric layer of the capacitor. The hydrogen included in the hydrogen supply layer may be supplied on the surface of the substrate through a metal or a conductive material, and damage to the substrate may be cured by the hydrogen. Thus, defects (such as gate induced drain leakage (GIDL) of the transistor due to substrate damage) may be reduced in the semiconductor device. Therefore, the semiconductor device may have excellent refresh characteristics. Further, the hydrogen supply layer may have a uniform thickness, and thus the semiconductor device may have uniform characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
 a substrate;
 a lower structure on the substrate, the lower structure including pad patterns and a lower insulation pattern between the pad patterns, upper surfaces of the pad patterns and the lower insulation pattern being at an outer side of the lower structure;
 a first etch stop layer on the pad patterns and the lower insulation pattern;
 a hydrogen supply layer including hydrogen, the hydrogen supply layer being on the first etch stop layer;
 a plurality of lower electrodes passing through the hydrogen supply layer and the first etch stop layer, the plurality of lower electrodes contacting the upper surfaces of the pad patterns; and
 a dielectric layer and an upper electrode sequentially stacked on a surface of each of the lower electrodes.

2. The semiconductor device as claimed in claim 1, wherein the hydrogen supply layer includes SiOCH or SiOC.

3. The semiconductor device as claimed in claim 1, wherein the first etch stop layer includes silicon nitride, SiCN, SiBN, or SiON.

4. The semiconductor device as claimed in claim 1, further comprising a second etch stop layer on the hydrogen supply layer.

5. The semiconductor device as claimed in claim 1, further comprising bit line structures on the substrate, wherein the hydrogen supply layer is farther from the substrate than bottoms of the bit line structures are from the substrate.

6. The semiconductor device as claimed in claim 1, wherein the substrate includes hydrogen diffused from the hydrogen supply layer.

7. A semiconductor device, comprising:
 a substrate;
 a lower structure including pad patterns on the substrate, upper surfaces of the pad patterns being at an outer side of the lower structure;
 a first etch stop layer on the pad patterns;
 a plurality of lower electrodes contacting the upper surfaces of the pad patterns;
 a dielectric layer and an upper electrode sequentially stacked on a surface of each of the lower electrodes; and
 a hydrogen supply layer including hydrogen, the hydrogen supply layer being between the lower electrodes and closer to the substrate than the dielectric layer is to the substrate,
 wherein at least portion of the hydrogen supply layer contacts the first etch stop layer.

8. The semiconductor device as claimed in claim 7, wherein the hydrogen supply layer fills a space between the pad patterns.

9. The semiconductor device as claimed in claim 7, further comprising a support pattern contacting sidewalls of at least portions of the lower electrodes.

10. The semiconductor device as claimed in claim 7, further comprising bit line structures on the substrate, wherein the hydrogen supply layer is farther from the substrate than bottoms of the bit line structures are from the substrate.

11. The semiconductor device as claimed in claim 7, wherein the substrate includes hydrogen diffused from the hydrogen supply layer.

12. The semiconductor device as claimed in claim 7, further comprising:
 a lower insulation pattern filling a space between the pad patterns; and
 the first etch stop layer is on the pad patterns and on the lower insulation pattern.

13. The semiconductor device as claimed in claim 12, wherein the first etch stop layer includes silicon nitride, SiCN, SiBN, or SiON.

14. The semiconductor device as claimed in claim 12, wherein:
 the hydrogen supply layer is on the first etch stop layer, and
 the hydrogen supply layer includes an oxide including carbon.

15. The semiconductor device as claimed in claim 14, wherein the hydrogen supply layer includes SiOCH or SiOC.

16. The semiconductor device as claimed in claim 12, further comprising a second etch stop layer on the hydrogen supply layer, wherein the hydrogen supply layer is between the first etch stop layer and the second etch stop layer.

17. The semiconductor device as claimed in claim 16, wherein the hydrogen supply layer includes a silicon oxide including hydrogen.

18. The semiconductor device as claimed in claim 16, wherein a thickness of the second etch stop layer is less than a thickness of the first etch stop layer.

* * * * *